(12) United States Patent
Nakamura et al.

(10) Patent No.: US 10,741,776 B2
(45) Date of Patent: Aug. 11, 2020

(54) FLEXIBLE LIGHT-EMITTING DEVICE, LIGHTING APPARATUS, AND IMAGE DISPLAY

(71) Applicant: Nitto Denko Corporation, Ibaraki-shi, Osaka (JP)

(72) Inventors: Kozo Nakamura, Ibaraki (JP); Daisuke Hattori, Ibaraki (JP); Jin Yoshikawa, Ibaraki (JP); Junichi Nagase, Ibaraki (JP); Kazuhito Hosokawa, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/763,697

(22) PCT Filed: Sep. 27, 2016

(86) PCT No.: PCT/JP2016/078398
§ 371 (c)(1),
(2) Date: Mar. 27, 2018

(87) PCT Pub. No.: WO2017/057332
PCT Pub. Date: Apr. 6, 2017

(65) Prior Publication Data
US 2018/0309073 A1    Oct. 25, 2018

(30) Foreign Application Priority Data

Sep. 29, 2015  (JP) .................................. 2015-192324

(51) Int. Cl.
*H01L 51/52* (2006.01)
*H01L 51/00* (2006.01)
(Continued)

(52) U.S. Cl.
CPC ........ *H01L 51/0097* (2013.01); *G02B 27/095* (2013.01); *H01L 27/3209* (2013.01);
(Continued)

(58) Field of Classification Search
CPC ............ H01L 51/0097; H01L 51/5275; H01L 51/5203; H01L 51/5237
See application file for complete search history.

(56) References Cited

U.S. PATENT DOCUMENTS

2006/0239886 A1   10/2006  Nakayama et al.
2011/0244225 A1   10/2011  Hattori et al.
(Continued)

FOREIGN PATENT DOCUMENTS

JP        61-32392 A     2/1986
JP     2004-281086 A    10/2004
(Continued)

OTHER PUBLICATIONS

Yildirim et al., "Template free preparation of nanoporous organically modified silica thin films on flexible substrates", Journal of Materials Chemistry, vol. 21, pp. 14830-14837, 2011, cited in the specification.
(Continued)

*Primary Examiner* — Douglas M Menz
(74) *Attorney, Agent, or Firm* — Westerman, Hattori, Daniels & Adrian, LLP

(57) ABSTRACT

The present invention provides a flexible light-emitting device which is a flexible device with which the light leakage is less liable to occur even if it is deformed. In order to achieve the above object, the flexible light-emitting device of the present invention includes a light-emitting layer, a low refractive index layer, and a high refractive index layer, wherein the light-emitting layer, the low refractive index layer, and the high refractive index layer are stacked in this order, the low refractive index layer has a refractive index lower than that of the light-emitting layer
(Continued)

and has a haze of less than 5%, and the high refractive index layer has a refractive index higher than that of the low refractive index layer.

7 Claims, 5 Drawing Sheets

(51) Int. Cl.
　　　H05B 33/12　　　(2006.01)
　　　G02B 27/09　　　(2006.01)
　　　H01L 27/32　　　(2006.01)
(52) U.S. Cl.
　　　CPC ...... *H01L 51/5203* (2013.01); *H01L 51/5237* (2013.01); *H01L 51/5275* (2013.01); *H05B 33/12* (2013.01); *H01L 2251/5338* (2013.01); *H01L 2251/5369* (2013.01)

(56) References Cited

U.S. PATENT DOCUMENTS

2012/0098421 A1　　4/2012　Thompson
2016/0072101 A1　　3/2016　Choi et al.

FOREIGN PATENT DOCUMENTS

| JP | 2005-275214 | A | 10/2005 |
|----|-------------|---|---------|
| JP | 2006-11175 | A | 1/2006 |
| JP | 2006-96019 | A | 4/2006 |
| JP | 2006-96967 | A | 4/2006 |
| JP | 2006-221144 | A | 8/2006 |
| JP | 2006-297329 | A | 11/2006 |
| JP | 2008-40171 | A | 2/2008 |
| JP | 2013-542464 | A | 11/2013 |
| JP | 2014-815 | A | 1/2014 |
| JP | 2015-92500 | A | 5/2015 |
| JP | 2015-99804 | A | 5/2015 |
| JP | 2015-118863 | A | 6/2015 |
| TW | 201523953 | A | 6/2015 |
| WO | 2012/054165 | A2 | 4/2012 |

OTHER PUBLICATIONS

International Search Report dated Nov. 8, 2016, issued in counterpart International Application No. PCT/JP2016/078398 (2 pages).
Office Action dated Aug. 8, 2019, issued in counterpart JP Application No. 2015-192324, with English translation. (6 pages).
Office Action dated Apr. 21, 2020, issued in counterpart JP Application No. 2015-192324, with English Translation. (4 pages).
Office Action dated May 22, 2020, issued in counterpart TW Application No. 105131309, partial English translation (9 pages).

FLEXIBLE LIGHT-EMITTING DEVICE, LIGHTING APPARATUS, AND IMAGE DISPLAY

TECHNICAL FIELD

The present invention relates to a flexible light-emitting device, a lighting apparatus, and an image display.

BACKGROUND ART

Disposing two substrates at a regular spacing forms an air layer which is a void space between the substrates. The air layer formed between the substrates serves as a low refractive index layer that reflects light entirely, for example. Thus, for example, in the case of an optical film, components such as a prism, a polarizing film, and a polarizing plate are disposed at regular spacings to provide air layers each of which serves as a low refractive index layer between the components. Forming air layers in such a manner, however, requires disposing the components at regular spacings, which does not allow the components to be stacked sequentially and causes time and trouble in production.

For solving such problems, there are attempts to develop a member such as a film having a low refractive index as a substitute for an air layer which is a void space between the components. Regarding such a member, as an example of achieving both a high porosity and a high strength, there is a method of applying the member to an antireflection layer of a lens (for example, see Patent Documents 1 to 4). In this method, a layer with void spaces (hereinafter, also referred to as a "void-provided layer") is formed on a lens and then baked at a high temperature of 150° C. or more for a long time. This method has the problem that the thus obtained void-provided layer is inferior in flexibility. On the other hand, there is an example of application of a void-provided layer which has not been subjected to baking treatment (for example, see Non-Patent Document 1). This method has the problem that the obtained void-provided layer is inferior in film strength and cannot impart an impact resistance.

There have been examples disclosing a method of forming a silica aerogel film on a long resin support (for example, see Patent Documents 5 and 6). However, the silica aerogel film obtained by this method has a refractive index of more than 1.30, which cannot be a substitute for an air layer by any means.

On the other hand, as a light-emitting device, a flexible device having flexibility receives attention nowadays (Patent Documents 7 and 8).

CITATION LIST

Patent Document(s)

Patent Document 1: JP 2006-297329 A
Patent Document 2: JP 2006-221144 A
Patent Document 3: JP 2006-011175 A
Patent Document 4: JP 2008-040171 A
Patent Document 5: JP 2006-096019 A
Patent Document 6: JP 2006-096967 A
Patent Document 7: JPS61 (1986)-32392 A
Patent Document 8: JP 2004-281086 A

Non-Patent Document(s)

Non-Patent Document 1: J. Mater. Chem., 2011, 21, 14830-14837

BRIEF SUMMARY OF THE INVENTION

Problem to be Solved by the Invention

The flexible device, however, has a problem that the light path changes, which causes the light leakage, when it is deformed and the curvature is increased.

Means for Solving Problem

In order to achieve the above object, the present invention provides a flexible light-emitting device including: a light-emitting layer, a low refractive index layer, and a high refractive index layer, wherein the light-emitting layer, the low refractive index layer, and the high refractive index layer are stacked in this order, the low refractive index layer has a refractive index lower than that of the light-emitting layer and has a haze of less than 5%, and the high refractive index layer has a refractive index higher than that of the low refractive index layer.

The present invention also provides a lighting apparatus including the flexible light-emitting device of the present invention.

The present invention also provides an image display including the flexible light-emitting device of the present invention.

Effects of the Invention

According to the flexible light-emitting device of the present invention having the above-described configuration, the light leakage is less liable to occur even if it is deformed. The uses of the flexible light-emitting device of the present invention are not limited to particular uses, and the flexible light-emitting device of the present invention can be used for the lighting apparatus and the image display of the present invention, for example.

DETAILED DESCRIPTION OF THE INVENTION

Figure 1:
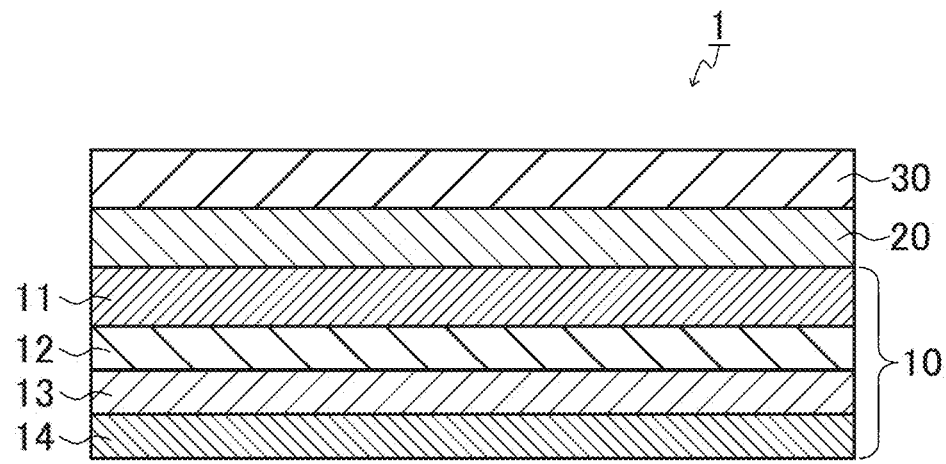
FIG. 1 is a cross sectional view schematically showing an example of the structure of the flexible light-emitting device of the present invention.

The present invention is described below in more detail with reference to illustrative examples. The present invention, however, is not limited by the following description.

Regarding the flexible light-emitting device of the present invention (hereinafter, also simply referred to as a "flexible light-emitting device" or a "flexible device of the present invention" or more simply referred to as a "flexible device"), the flexible device is configured by stacking a low refractive index layer on a light-emitting layer having flexibility (i.e., flexible light-emitting layer). According to such a configuration, the light greatly angled from the front direction (a direction orthogonal to the light-emitting surface of the light-emitting layer) is totally reflected at the interface between the light-emitting layer and the low refractive index layer when the light is emitted from the light-emitting layer to the low refractive index layer side. The light reflected by the total reflection returns to the light-emitting layer side and does not leak out to the visible side (the light is not emitted to the visible side). Thereby, the light leakage to unnecessary directions greatly angled from the front direction can be suppressed. Thus, even if the flexible light-emitting device of the present invention is deformed and the curvature is increased, the light leakage is less liable to occur. When a high refractive index layer (for example, cover layer or the like) is directly stacked on a light-emitting layer without involving a low refractive index layer, the light leakage is liable to occur. According to the present invention, the light leakage can be suppressed owing to the low refractive index layer as described above.

In the flexible light-emitting device of the present invention, as described above, the light-emitting layer, the low refractive index layer, and the high refractive index layer are stacked in this order. Other component(s) (for example, other layer(s)) may or may not be provided appropriately between the above-described layers. For example, the above-described layers may be stacked through a pressure-sensitive adhesive/adhesive layer. More specifically, for example, the high refractive index layer and the low refractive index layer may be stacked through a pressure-sensitive adhesive/adhesive layer as described below. Also, for example, the light-emitting layer and the low refractive index layer may be stacked through a pressure-sensitive adhesive/adhesive layer. Note that, in the present invention, the "flexible light-emitting device" denotes a light-emitting device having flexibility (flexible light-emitting device), and each of the layers configuring the flexible device has flexibility, for example.

The refractive index of the low refractive index layer is not particularly limited, and the upper limit thereof is, for example, less than 1.20, 1.15 or less, or 1.10 or less, the lower limit thereof is, for example, 1.05 or more, 1.06 or more, or 1.07 or more, and the refractive index is, for example, 1.05 or more and less than 1.20, or is in the range from 1.06 to 1.15 or 1.07 to 1.10.

In the flexible light-emitting device of the present invention, the light-emitting layer may include an organic electroluminescence (EL) layer. That is, the flexible light-emitting device of the present invention may be an organic EL device. The flexible light-emitting device of the present invention is not limited to organic EL devices and can be any light-emitting devices. Examples of the flexible light-emitting device other than the organic EL device include inorganic ELs, electronic paper, and light-emitting diodes. Note that the organic EL device (organic EL element) is also referred to as an organic light-emitting diode (OLED).

In the flexible light-emitting device of the present invention, the light-emitting layer may further include a base, a first electrode, and a second electrode, and the first electrode, the organic EL layer, and the second electrode may be stacked on the base in this order. The low refractive index layer and the high refractive index layer may be stacked on the base on the side opposite that where the first electrode, the organic EL layer, and the second electrode are stacked.

In the flexible light-emitting device of the present invention, for example, the low refractive index layer may have an abrasion resistance showing a film strength, measured with BEMCOT®, of 60% to 100%. Furthermore, for example, the low refractive index layer may have a folding endurance showing flexibility, measured by the MIT test, of 100 times or more.

In the low refractive index layer of the flexible light-emitting device of the present invention, one kind or two or more kinds of structural units that form a structure with minute void spaces may be chemically bonded. The chemical bond among the structural units may include a direct bond or an indirect bond, for example. Note that, in the low refractive index layer of the flexible light-emitting device of the present invention, it is only required that at least some of the structural units are chemically bonded, for example. Specifically, there may be a part at which the structural units are in contact with each other but not chemically bonded, for example. Note that, in the present invention, "the structural units are "indirectly bonded"" means that the structural units are bonded through binder components each of which is smaller in amount than the structural unit. On the other hand, "the structural units are "directly bonded"" means that the structural units are bonded to one another directly without involving binder components and the like.

In the low refractive index layer of the flexible light-emitting device of the present invention, for example, the bond among the structural units may include a hydrogen bond or a covalent bond. The structural units may have a structure having at least one shape of a particle, fiber, and a plate, for example. Each of the structural unit in the shape of a particle and the structural unit in the shape of a plate may be made of an inorganic matter, for example. The constituent element of the structural unit in the shape of a particle may include at least one element selected from the group consisting of Si, Mg, Al, Ti, Zn, and Zr, for example. The structure (structural unit) in the shape of a particle may be a solid particle or a hollow particle, and specific examples thereof include silicon particles, silicon particles with micropores, silica hollow nanoparticles, and silica hollow nanoballoons. The structural unit in the shape of fiber can be, for example, nanofiber having a nano-sized diameter, and specific examples thereof include cellulose nanofiber and alumina nanofiber. The structural unit in the shape of a plate can be, for example, nanoclay. Specifically, the structural unit in the shape of a plate can be, for example, nano-sized bentonite (for example, Kunipia F [product name]). The structural unit in the shape of fiber may be at least one fibrous matter selected from the group consisting of carbon nanofiber, cellulose nanofiber, alumina nanofiber, chitin nanofiber, chitosan nanofiber, polymer nanofiber, glass nanofiber, and silica nanofiber, for example, although it is not particularly limited.

The low refractive index layer of the flexible light-emitting device of the present invention is, for example, a porous body containing microporous particles. In the present invention, the shape of the "particle" (for example, the microporous particle) is not limited to particular shapes, and can be, for example, a spherical shape, a non-spherical shape, and the like. Furthermore, in the present invention, the microporous particle may be, for example, a sol-gel beaded particle, a nanoparticle (hollow nanosilica/nanoballoon particle), nanofiber, and the like as described above.

The low refractive index layer of the flexible light-emitting device of the present invention has a proportion of void space of 40% or more, for example.

The low refractive index layer of the flexible light-emitting device of the present invention has a pore size in the range from 2 to 200 nm, for example.

The low refractive index layer of the flexible light-emitting device of the present invention has a thickness in the range from 0.01 to 100 µm, for example.

The low refractive index layer of the flexible light-emitting device of the present invention has a haze showing transparency of less than 5%, preferably 3% or less, more preferably 2% or less, and particularly preferably 1% or less.

The low refractive index layer may include an acid or a base that increases the strength of the low refractive index layer by at least one of light irradiation and heating, for example.

In the method of producing a flexible light-emitting device of the present invention, for example, the structural units may be directly bonded to form the low refractive index layer or the structural units may be indirectly bonded to form the low refractive index layer. Furthermore, for example, the low refractive index layer may be formed such that the bond among the structural units includes a hydrogen bond or a covalent bond.

In the method of producing a flexible light-emitting device of the present invention, for example, the structural unit may be a structural unit having at least one shape selected from the group consisting of a particle, fiber, and a plate. Each of the structural unit in the shape of a particle and the structural unit in the shape of a plate may be made of an inorganic matter, for example. The constituent element of the structural unit in the shape of a particle may include at least one element selected from the group consisting of Si, Mg, Al, Ti, Zn, and Zr, for example. The structural unit may include a microporous particle, for example.

The present invention is described below specifically in more detail. The present invention, however, is not limited or restricted by the following description.

[1. Flexible Light-Emitting Device]

In a flexible light-emitting device of the present invention, as described above, a light-emitting layer, a low refractive index layer, and a high refractive index layer are stacked in this order, and other component(s) (for example, other layer(s)) may or may not be provided appropriately between the above-described layers. The present invention is described below mainly with reference to the case where the light-emitting layer includes an organic EL layer, i.e., the case where the flexible light-emitting device of the present invention is an organic EL device. The flexible light-emitting device of the present invention, however, is not limited to the organic EL device as described above and can be any other flexible light-emitting devices. In other words, the light-emitting layer may include any other light-emitting layer(s) in place of or in addition to the organic EL layer.

[1-1. Configuration Example of Flexible Light-Emitting Device]

FIG. 1 is a cross sectional view schematically showing an example of the configuration of the flexible light-emitting device of the present invention. As shown in FIG. 1, in this flexible light-emitting device 1, a light-emitting layer 10, a low refractive index layer 20, and a high refractive index layer 30 are stacked in this order. The light-emitting layer 10 is configured such that a first electrode 12, an organic EL layer (light-emitting layer) 13, and a second electrode 14 are stacked on a base 11 in this order. The low refractive index layer 20 and the high refractive index layer 30 are stacked on the base 11 on the side opposite that where the first electrode 12, the organic EL layer (light-emitting layer) 13, and the second electrode 14 are stacked.

The base 11 is not limited to particular bases, and examples thereof include metallic plates and metallic foil of aluminum (Al), copper (Cu), and stainless (SUS); resin plates and resin films of polyethylene (PE), polypropylene (PP), polystyrene (PS), polycarbonate (PC), polyimide (PI), methacrylate resin (PMMA), polyethylene terephthalate (PET), polyethylene naphthalate (PEN), acryl, cellulose acetate propionate (CAP), cycloolefin polymer (COP), and triacetate (TAC); and flexible glass. In the present invention, the base is not limited to these bases, and other materials that can be applied to the production by the Roll to Roll process described below can be used, for example. Preferably, the base is a long band-like substrate having a width in the range from 10 to 100 mm, a length in the range from 10 to 2000 m, and a recoverable curvature radius of 30 mm or more, for example. More preferably, the base is a long band-like base having a width in the range from 30 to 60 mm, a length in the range from 200 to 2000 m, and a recoverable curvature radius of 10 mm or more.

In the embodiment of the flexible light-emitting device shown in FIG. 1, for extracting (emitting) the light emitted from the organic EL layer 13 from the base 11 side, preferably, the base 11 is a highly translucent base. In the case where the light is extracted from the side remote from the base 11 (for example, in the case where the low refractive index layer 20 and the high refractive index layer 30 are stacked on the second electrode 14 (undersurface of the second electrode 14) in this order in FIG. 1), the base 11 is not necessarily translucent.

When a conductive base is used as the base, the surface where the organic EL element is formed needs to have an insulating property. Thus, when a conductive base is used, there is a need to provide an insulating layer on the conductive base. The insulating layer can be, for example, an inorganic insulating layer, an organic insulating layer, or a laminate of an inorganic insulating layer and an organic insulating layer. The organic EL element may be formed on the insulating layer.

The inorganic insulating layer preferably contains at least one kind of metals and metalloids. The at least one kind of metals and metalloids is, preferably, at least one kind selected from the group consisting of oxide, nitride, carbide, oxynitride, oxycarbide, nitricarbide, and oxynitricarbide. Examples of the metal include zinc, aluminum, titanium, copper, and magnesium. Examples of the metalloid include silicon, bismuth, and germanium.

As the organic insulating layer, an insulative resin layer can be used. Since there is a case where the conductive base is heated to 150 to 300° C. during the manufacturing process, it is preferable to select a heat-resistant resin having a glass-transition temperature of 150° C. or more. Specific examples of the resin include an acrylic resin, a norbornene resin, an epoxy resin, a polyimide resin, a polyamide-imide resin, a polyamide resin, a polyester resin, a polyarylate resin, a polyurethane resin, a polycarbonate resin, a polyetherketone resin, a polyphenylsulfone resin, and complexes of these resins. Among them, the resin is preferably at least one kind selected from the group consisting of an acrylic resin, a norbornene resin, an epoxy resin, and a polyimide resin.

The first electrode (first electrode layer) 12 is not particularly limited, and examples thereof include metals such as indium tin oxide (ITO), indium tin oxide containing silicon oxide (ITSO), indium zinc oxide (IZO®), gold, platinum, nickel, tungsten, copper, and aluminum; alkali metals such as lithium and cesium; alkali earth metals such as magnesium and calcium; rare earth metals such as ytterbium; and alloys such as aluminum-lithium alloy and magnesium-silver alloy.

The method of forming the first electrode 12 is not limited to particular methods, and a common method may be used appropriately, for example. The first electrode 12 can be formed, for example, by sputtering, vapor deposition, chemical vapor deposition (CVD), or photolithography. The first electrode 12 may be formed using a shadow mask, for example. Examples of the shadow mask include, but are not limited to, shadow masks made of metal such as stainless (SUS), aluminum (Al), and copper (Cu). The thickness of the shadow mask is, for example, 10 to 2000 μm or 20 to 500 μm.

The organic EL layer 13 includes at least a hole transport layer, a light-emitting layer, and an electron transport layer, and may include a hole injection layer and an electron injection layer as needed. When the first electrode 12 is an anode and the second electrode (second electrode layer) 14 is a cathode, for example, the hole injection layer, the hole transport layer, the light-emitting layer, the electron transport layer, and the electron injection layer are stacked in this order in the organic EL layer 13 from the first electrode 12 side to the second electrode 14 side. In contrast, when the first electrode 12 is a cathode and the second electrode 14 is an anode, for example, the hole injection layer, the hole transport layer, the light-emitting layer, the electron transport layer, and the electron injection layer are stacked in this order in the organic EL layer 13 from the second electrode 14 side to the first electrode 12 side.

The material for forming a hole transport layer is not limited to particular materials as long as it has a hole transporting function. Examples of the material for forming a hole transport layer include aromatic amine compounds such as 4,4'-bis[N-(1-naphthyl)-N-phenylamino]biphenyl (NPB) and 4,4'-bis[N-(3-methylphenyl)-N-phenylamino]biphenyl (TPD); carbazole derivatives such as 1,3-bis(N-carbazolyl)benzene; and high-molecular compounds. One kind of the materials for forming a hole transport layer may be used alone or two or more kinds of them may be used in combination. The hole transport layer may have a multilayer structure having two or more layers.

The material for forming a hole injection layer is not limited to particular materials, and examples thereof include metallic oxides such as HAT-CN (1,4,5,8,9,12-hexaazatriphenylene hexacarbonitrile), vanadium oxide, niobium oxide, and tantalum oxide; phthalocyanine compounds such as phthalocyanine; high-molecular compounds such as a mixture (PEDOT/PSS) of 3,4-ethylenedioxythiophene and polystyrene sulfonate; and the above-described materials for forming a hole transport layer. One kind of the materials for forming a hole injection layer may be used alone or two or more kinds of them may be used in combination.

The material for forming a light-emitting layer is not limited to particular materials as long as it is a light-emitting material. Examples of the material for forming a light-emitting layer include low molecular light-emitting materials such as low molecular fluorescence-emitting materials and low molecular phosphorescence-emitting materials. The material for forming a light-emitting layer may be a material having both a light-emitting function and an electron transporting function or a hole transporting function.

Examples of the low molecular light-emitting material include aromatic dimethylidene compounds such as 4,4'-bis(2,2'-diphenylvinyl)-biphenyl (DPVBi); oxadiazole compounds such as 5-methyl-2-[2-[4-(5-methyl-2-benzoxazolyl)phenyl]vinyl]benzoxazole; triazole derivatives such as 3-(4-biphenylyl)-4-phenyl-5-t-butylphenyl-1,2,4-triazole; styrylbenzene compounds such as 1,4-bis(2-methylstyryl)benzene; organometallic complexes such as azomethine zinc complex and tris(8-quinolinolato)aluminum ($Alq_3$); benzoquinone derivatives; naphthoquinone derivatives; anthraquinone derivatives; and fluorenone derivatives.

As the material for forming a light-emitting layer, a material obtained by doping a host material with a light-emitting dopant material may be used.

As the host material, for example, the above-described low molecular light-emitting materials can be used. Besides these, carbazole derivatives such as 1,3-bis(N-carbazolyl)benzene (mCP), 2,6-bis(N-carbazolyl)pyridine, 9,9-di(4-dicarbazole-benzyl)fluorene (CPF), and 4,4'-bis(carbazole-9-yl)-9,9-dimethyl-fluorene (DMFL-CBP) can be used.

Examples of the dopant material include phosphorescence-emitting metal complexes such as organic iridium complexes including tris(2-phenylpyridyl)iridium (III) (Ir $(ppy)_3$) and tris(1-phenylisoquinoline)iridium (III) ($Ir(piq)_3$); styryl derivatives; and perylene derivatives.

Furthermore, the material for a light-emitting layer may contain the above-described materials for a hole transport layer, the materials for forming an electron transport layer described below, and various kinds of additives.

The material for forming an electron transport layer is not limited to particular materials as long as it has an electron transporting function. Examples of the material for forming an electron transport layer include metal complexes such as bis(2-methyl-8-quinolinolato)(4-phenylphenolato) aluminum (BAlq); heteroaromatic compounds such as 2-(4-biphenylyl)-5-(4-tert-butylphenyl)-1,3,4-oxadiazole (PBD) and 1,3-bis[5-(p-tert-butylphenyl)-1,3,4-oxadiazole-2-yl]benzene (OXD-7); and high-molecular compounds such as poly(2,5-pyridine-diyl) (PPy). One kind of the materials for forming an electron transport layer may be used alone or two or more kinds of them may be used in combination. The electron transport layer may have a multilayer structure having two or more layers.

The material for forming an electron injection layer is not limited to particular materials, and examples thereof include alkali metal compounds such as lithium fluoride (LiF) and cesium fluoride (CsF); alkali earth metal compounds such as calcium fluoride ($CaF_2$); and the above-described materials for forming an electron transport layer. One kind of the materials for forming an electron injection layer may be used alone or two or more kinds of them may be used in combination. The electron injection layer may have a multilayer structure having two or more layers.

The method of forming layers that configure the organic EL layer is not limited to particular methods, and a common method may be used. Examples of the method include sputtering, vapor deposition, an ink-jet method, and coating. Examples of the method of patterning the organic EL layer include a shadow mask method and photolithography. From the viewpoint of the damage to the organic EL layer, the resist residue, and the number of processes, preferably, the layers are formed using a shadow mask for forming an organic EL layer in the organic EL layer forming step.

As the second electrode 14, metals such as indium tin oxide (ITO), indium tin oxide containing silicon oxide (ITSO), gold, platinum, nickel, tungsten, copper, and aluminum; alkali metals such as lithium and cesium; alkali earth metals such as magnesium and calcium; a rare earth metal such as ytterbium; and alloys such as aluminum-lithium alloy and magnesium-silver alloy can be used.

The method of forming a second electrode 14 is not limited to particular methods, and can be a common method. For example, the second electrode 14 can be formed by sputtering, vapor deposition, CVD, or the like. Examples of the method of patterning the second electrode layer include a shadow mask method and photolithography.

As described above, either one of the first electrode 12 and the second electrode 14 may be a cathode or an anode and the other may be an anode or a cathode. In the embodiment of the flexible light-emitting device shown in FIG. 1, for extracting (emitting) the light emitted from the organic EL layer 13 from the first electrode 12 side, preferably, the first electrode 12 is made of a highly translucent material (e.g., ITO, IZO, IGZO, SnO2, ZnO, AZO, ATO, etc.). In the case where the light is extracted from the second electrode 14 side (for example, in the case where the low refractive index layer 20 and the high refractive index layer 30 are stacked on the second electrode 14 (undersurface of the second electrode 14) in this order in FIG. 1), preferably, the second electrode 14 is made of a highly translucent material.

The high refractive index layer 30 is not limited to particular layers as long as it has a refractive index higher than that of the low refractive index layer 20, and examples thereof include metallic plates and metallic foil of aluminum (Al), copper (Cu), and stainless (SUS); resin plates and resin films of polyethylene (PE), polypropylene (PP), polystyrene (PS), polycarbonate (PC), polyimide (PI), methacrylate resin (PMMA), polyethylene terephthalate (PET), polyethylene naphthalate (PEN), acryl, cellulose acetate propionate (CAP), cycloolefin polymer (COP), and triacetate (TAC); plastic; and flexible glass. Preferably, the high refractive index layer 30 is made of a highly translucent material.

The low refractive index layer (hereinafter, also referred to as a "low refractive index layer of the present invention") in the flexible light-emitting device of the present invention is described below. Regarding the low refractive index layer 20 shown in FIG. 1, reference can be made to the description below.

[1-2. Low Refractive Index Layer]

The low refractive index layer of the present invention may be stacked on a resin film, and may be directly stacked on the resin film or indirectly stacked on the resin film through another layer, for example.

The low refractive index layer of the present invention, as described above, may have an abrasion resistance showing a film strength, measured with BEMCOT®, in the range from 60% to 100%, for example. The present invention having such a film strength is resistant to a physical impact in winding during production and in use, for example. The lower limit of the abrasion resistance is, for example, 60% or more, 80% or more, or 90% or more, the upper limit thereof is, for example, 100% or less, 99% or less, or 98% or less, and the abrasion resistance is, for example, in the range from 60% to 100%, 80% to 99%, or 90% to 98%.

The low refractive index layer of the present invention has an abrasion resistance showing a film strength, measured with BEMCOT®, in the range from 60% to 100% and the folding endurance showing flexibility, measured by an MIT test, of 100 times or more, for example. When the low refractive index layer includes silicon (Si), for example, the abrasion resistance can be measured according to the method described below. When the low refractive index layer includes an element other than silicon (Si), for example, the abrasion resistance can be measured with reference to the method described below.

(Evaluation of Abrasion Resistance)

(1) Avoid-provided layer (the low refractive index layer of the present invention) formed on an acrylic film by coating is cut into a circle having a diameter of about 15 mm as a sample.

(2) Next, as to the sample, the coating amount of Si ($Si_0$) is measured by identifying silicon by X-ray fluorescence (product of Shimadzu Corporation, product name: ZSX Primus II). Subsequently, the void-provided layer on the acrylic film in proximity to the site where the circular sample was obtained is cut so as to have a piece having a size of 50 mm×100 mm, the obtained piece is fixed to a glass plate (thickness: 3 mm), and a sliding test is performed using BEMCOT®. The sliding condition is as follows: weight: 100 g, reciprocation: 10 times.

(3) The sampling and X-ray fluorescence measurement of the void-provided layer after finishing sliding are performed in the same manner as the above-described item (1) to measure the residual amount of Si ($Si_1$) after an abrasion test. The abrasion resistance is defined by the residual ratio of Si (%) before and after the sliding test using BEMCOT®, and is represented by the following formula.

$$\text{Abrasion resistance (\%)} = [\text{residual amount of Si}(Si_1)/\text{coating amount of Si }(Si_0)] \times 100(\%)$$

The folding endurance of the low refractive index layer of the present invention measured by the MIT test is, for example, 100 times or more as described above. The folding endurance shows flexibility, for example. Since the present invention has such flexibility, for example, a superior winding ability in continuous production and a superior handleability in use can be achieved, for example.

The lower limit of the folding endurance is, for example, 100 times or more, 500 times or more, or 1000 times or more, the upper limit of the folding endurance is not particularly limited, and is, for example, 10000 times or less, and the folding endurance is, for example, in the range from 100 to 10000 times, 500 to 10000 times, or 1000 to 10000 times.

The flexibility means deformability of a substance, for example. The folding endurance by the MIT test can be measured, for example, by the method described below.

(Evaluation of Folding Endurance Test)

The void-provided layer (the low refractive index layer of the present invention) is cut into a piece having a size of 20 mm×80 mm, then the obtained piece is attached to a MIT folding endurance tester (product of TESTER SANGYO CO., LTD., product name: BE-202), and 1.0 N load is applied thereto. A chuck of R 2.0 mm for holding the void-provided layer is used, application of load is at most 10000 times, and the number of times of application of load at the time of fracture of the void-provided layer is assumed as the folding endurance.

The film density of the low refractive index layer of the present invention is not particularly limited, and the lower limit thereof is, for example, 1 $g/cm^3$ or more, 10 $g/cm^3$ or more, 15 $g/cm^3$ or more, the upper limit thereof is, for example, 50 $g/cm^3$ or less, 40 $g/cm^3$ or less, 30 $g/cm^3$ or less, or 2.1 $g/cm^3$ or less, and the film density is, for example, in the range from 5 to 50 $g/cm^3$, 10 to 40 $g/cm^3$, 15 to 30 $g/cm^3$, or 1 to 2.1 $g/cm^3$. In the low refractive index layer of the present invention, the lower limit of the porosity based on the film density is, for example, 50% or more, 70% or more, or 85% or more, the upper limit thereof is, for example, 98% or less or 95% or less, and the porosity is, for example, in the range from 50% to 98%, 70% to 95%, or 85% to 95%.

The film density can be measured, for example, by the method described below, and the porosity can be calculated, for example, as described below based on the film density.

(Evaluation of Film Density and Porosity)

After forming a void-provided layer (the low refractive index layer of the present invention) on a base (acrylic film), the X-ray reflectivity in a total reflection region of the void-provided layer of this laminate is measured using an X-ray diffractometer (product of RIGAKU, product name: RINT-2000). Then, after fitting with Intensity at 2θ, the film density (g/cm$^3$) is calculated from the total reflection angle of the laminate (void-provided layer and base), and the porosity (P %) is calculated by the following formula.

Porosity ($P$ %)=45.48×film density (g/cm$^3$)+100(%)

The low refractive index layer has a pore structure, for example. The size of a void space (pore) in the present invention indicates not the diameter of the short axis but the diameter of the long axis of the void space. The size of a void space (pore) is preferably in the range from 2 nm to 500 nm, for example. The lower limit of the size of a void space is, for example, 2 nm or more, 5 nm or more, 10 nm or more, or 20 nm or more, the upper limit of the size of a void space is, for example, 500 nm or less, 200 nm or less, or 100 nm or less, and the size of a void space is, for example, in the range from 2 nm to 500 nm, 5 nm to 500 nm, 10 nm to 200 nm, or 20 nm to 100 nm. A preferable size of a void space changes depending on application of the void-provided structure. Thus, the size of a void space should be adjusted to a desired size according to purposes, for example. The size of a void space can be evaluated by the method described below.

(Evaluation of Size of Void Space)

In the present invention, the size of a void space can be quantified according to the BET test. Specifically, 0.1 g of a sample (low refractive index layer of the present invention) is set in the capillary of a surface area measurement apparatus (product of Micromeritics, product name: ASAP 2020), and dried under a reduced pressure at room temperature for 24 hours to remove gas from the void-provided structure. Then, an adsorption isotherm is created by adsorbing a nitrogen gas to the sample, thereby obtaining a pore distribution. The size of a void space can thereby be evaluated.

It is only required that the low refractive index layer of the present invention has a pore structure (porous structure) as described above, for example, and the low refractive index layer may have an open-cell structure in which the pore structures are interconnected, for example. The open-cell structure means, for example, that the pore structures are three-dimensionally interconnected in the low refractive index layer (for example, silicone porous body) of the present invention, i.e., void spaces in the pore structures are interconnected. When a porous body has an open-cell structure, the porosity of the bulk body can be increased. However, an open-cell structure cannot be formed with closed-cell particles such as hollow silica. In this regard, for example, when the silica sol particles (pulverized products of a gelled silicon compound which forms sol) are used, since the particle has a three-dimensional dendritic structure, the low refractive index layer of the present invention can form an open-cell structure easily by settlement and deposition of the dendritic particles in a coating film (sol coating film containing the pulverized products of a gelled silicon compound). The low refractive index layer of the present invention preferably forms a monolith structure in which the open-cell structure has multiple pore distributions. The monolith structure denotes a hierarchical structure including a structure in which nano-sized void spaces are present and an open-cell structure in which the nano-sized void spaces are aggregated, for example. The monolith structure can impart a film strength with minute void spaces while imparting a high porosity with coarse open-cell structure, so that both a film strength and a high porosity can be achieved, for example. For forming such a monolith structure, for example, it is preferable to control the pore distribution of a void-provided structure to be created in a gel (gelled silicon compound) before pulverizing into the silica sol particles. For example, by controlling the particle size distribution of silica sol particles after pulverization to a desired size in pulverization of the gelled silicon compound, the monolith structure can be formed.

The haze showing transparency of the low refractive index layer of the present invention is not particularly limited, and the upper limit thereof is, for example, less than 5% and preferably less than 3%, the lower limit thereof is, for example, 0.1% or more or 0.2% or more, and the haze is, for example, 0.1% or more and less than 5% or 0.2% or more and less than 3%.

The haze can be measured, for example, by the method described below.

(Evaluation of Haze)

Avoid-provided layer (low refractive index layer of the present invention) is cut into a piece having a size of 50 mm×50 mm, and the obtained piece is set in a haze meter (product of Murakami Color Research Laboratory, product name: HM-150) to measure a haze. The haze value is calculated by the following formula.

Haze (%)=[diffuse transmittance (%)/total light transmittance (%)]×100(%)

Commonly, a ratio between the transmission speed of the wavefront of light in vacuum and the phase velocity of light in a medium is called a refractive index of the medium. The upper limit of the refractive index of the low refractive index layer of the present invention is, for example, 1.20 or less or 1.15 or less, the lower limit thereof is, for example, 1.05 or more, 1.06 or more, or 1.07 or more, and the refractive index is, for example, in the range from 1.05 to 1.20, 1.06 to 1.20, or 1.07 to 1.15.

In the present invention, the refractive index (for example, the refractive index of the low refractive index layer of the present invention) is a refractive index measured at the wavelength of 550 nm unless otherwise stated. The method of measuring a refractive index is not limited to particular methods, and the refractive index can be measured, for example, by the method described below.

(Evaluation of Refractive Index)

After forming a void-provided layer (low refractive index layer of the present invention) on an acrylic film, the obtained laminate is cut into a piece having a size of 50 mm×50 mm, and the obtained piece is laminated on the front surface of a glass plate (thickness: 3 mm) through a pressure-sensitive adhesive layer. The center of the back surface of the glass plate (diameter: about 20 mm) is solidly painted with a black magic marker, thereby preparing a sample which allows no reflection at the back surface of the glass plate. The sample is set in an ellipsometer (product of J. A. Woollam Japan, product name: VASE), the refractive index is measured at the wavelength of 500 nm and at the incidence angle of 50° to 80°, and the average value is assumed as a refractive index.

When the low refractive index layer of the present invention is formed on the resin film, for example, the peel strength showing adhesion between the low refractive index layer and the resin film is not particularly limited, and the lower limit thereof is, for example, 1 N/25 mm or more, 2 N/25 mm or more, or 3 N/25 mm or more, the upper limit thereof is, for example, 30 N/25 mm or less, 20 N/25 mm or less, or 10 N/25 mm or less, and the peel strength is, for example, in the range from 1 to 30 N/25 mm, 2 to 20 N/25 mm, or 3 to 10 N/25 mm.

The method of measuring the peel strength is not particularly limited, and the peel strength can be measured by the method described below, for example.

(Evaluation of Peel Strength)

After forming the void-provided layer (low refractive index layer of the present invention) on the acrylic film, a piece having a size of 50 mm×140 mm is obtained as a sample and the sample is fixed to a stainless plate with a double-sided tape. An acrylic pressure-sensitive adhesive layer (thickness: 20 μm) is laminated to a PET film (product of Mitsubishi Plastics, Inc., product name: T100), the thus obtained adhesive tape is cut into a piece having a size of 25 mm×100 mm, and the obtained piece is laminated to the void-provided layer to form a laminate of the PET film and the void-provided layer. Then, the sample is chucked in a tensile testing machine (product of Shimadzu Corporation, product name: AG-Xplus) with a chuck space of 100 mm, and the tensile test is performed at the tensile speed of 0.3 m/min. The average of 50 mm peel test is assumed as the peel strength.

The thickness of the low refractive index layer of the present invention is not particularly limited, and the lower limit thereof is, for example, 0.01 μm or more, 0.05 μm or more, 0.1 μm or more, or 0.3 μm or more, the upper limit thereof is, for example, 100 μm or less, 80 μm or less, 50 μm or less, or 10 μm or less, and the thickness is, for example, in the range from 0.01 to 100 μm.

As described above, the low refractive index layer of the present invention contains pulverized products of a gelled compound, wherein the pulverized products are chemically bonded by catalysis, for example. In the low refractive index layer of the present invention, the pattern of the bond (chemical bond) among the pulverized products is not limited to particular patterns. Specifically, the chemical bond can be, for example, a crosslinking bond. The method of chemically bonding the pulverized products is described in detail in the description as to the production method of the present invention.

The gel form of the gelled compound is not limited to particular forms. The "gel" commonly denotes a solidified state of solutes aggregated as they lost independent motility due to interaction. Commonly, a wet gel is a gel containing a dispersion medium in which solutes form a uniform structure, and a xerogel is a gel from which a solvent is removed and in which solutes form a network structure with void spaces. In the present invention, the gelled compound can be a wet gel or a xerogel, for example.

The gelled compound can be, for example, a gelled product obtained by gelating monomer compounds. Specifically, the gelled silicon compound can be, for example, a gelled product in which the monomer silicon compounds are bonded. As a specific example, the gelled silicon compound can be a gelled product in which the monomer silicon compounds are bonded by a hydrogen bond or an intermolecular bond. The bond can be, for example, a bond by dehydration condensation. The method of gelation is described below in the description as to the production method of the present invention.

In the low refractive index layer of the present invention, the volume average particle size showing particle size variations of the pulverized product is not particularly limited, and the lower limit thereof is, for example, 0.10 μm or more, 0.20 μm or more, or 0.40 μm or more, the upper limit thereof is, for example, 2.00 μm or less, 1.50 μm or less, or 1.00 μm or less, and the volume average particle size is, for example, in the range from 0.10 μm to 2.00 μm, 0.20 μm to 1.50 μm, or 0.40 μm to 1.00 μm. The particle size distribution can be measured, for example, using a particle size distribution analyzer based on dynamic light scattering, laser diffraction, or the like or using an electron microscope such as a scanning electron microscope (SEM) or a transmission electron microscope (TEM).

The particle size distribution showing particle size variations of the pulverized product is not particularly limited. The distribution of the particle having a particle size of 0.4 μm to 1 μm is in the range from 50 wt % to 99.9 wt %, 80 wt % to 99.8 wt %, or 90 wt % to 99.7 wt % or the distribution of the particle having a particle size of 1 μm to 2 μm is in the range from 0.1 wt % to 50 wt %, 0.2 wt % to 20 wt %, or 0.3 wt % to 10 wt %, for example. The particle size distribution can be measured, for example, using a particle size distribution analyzer or an electron microscope.

In the low refractive index layer of the present invention, the kind of the gelled compound is not limited to particular kinds. The gelled compound can be, for example, a gelled silicon compound. The present invention is described below with reference to an example in which the gelled compound is a gelled silicon compound. The present invention, however, is not limited thereto.

The crosslinking bond is, for example, a siloxane bond. Examples of the siloxane bond include T2 bond, T3 bond, and T4 bond shown below. In the case where the low refractive index layer of the present invention has the siloxane bond, the porous body of the present invention may have one of, two of, or all of the above-mentioned three bond patterns, for example. The silicone porous body having higher proportions of T2 and T3 is superior in flexibility and can be expected to have an original property of a gel but is inferior in film strength. On the other hand, the silicone porous body having a higher proportion of T4 is superior in film strength but has small-sized void spaces and is inferior in flexibility. Thus, it is preferable to change the proportions of T2, T3, and T4 depending on applications, for example.

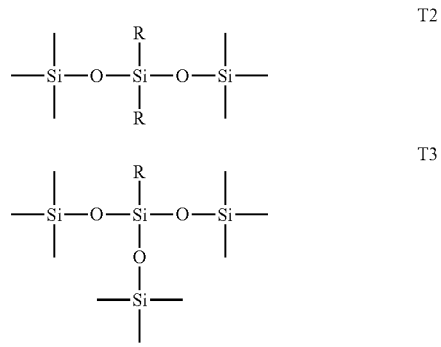

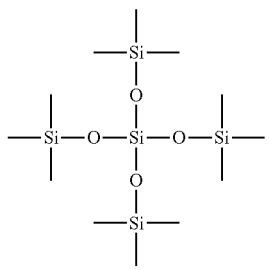

In the case where the low refractive index layer of the present invention has the siloxane bond, the relative ratio among T2, T3, and T4 with T2 being considered as "1" is, for example, as follows: T2:T3:T4=1:[1 to 100]:[0 to 50], 1:[1 to 80]:[1 to 40], or 1:[5 to 60]:[1 to 30].

The silicon atoms contained in the low refractive index layer of the present invention are preferably bonded by a siloxane bond, for example. As a specific example, the proportion of the unbonded silicon atoms (i.e., residual silanol) among all the silicon atoms contained in the low refractive index layer is, for example, less than 50%, 30% or less, or 15% or less.

When the gelled compound is the gelled silicon compound, the monomer silicon compound is not limited to particular compounds. The monomer silicon compound can be, for example, a compound represented by the following chemical formula (1). When the gelled silicon compound is a gelled product in which monomer silicon compounds are bonded by a hydrogen bond or an intermolecular bond as described above, monomers in the chemical formula (1) can be bonded by a hydrogen bond through their hydroxyl groups, for example.

(1)

In the chemical formula (1), for example, X is 2, 3, or 4, and $R^1$ represents a linear or a branched alkyl group. The carbon number of $R^1$ is, for example, 1 to 6, 1 to 4, or 1 to 2. Examples of the linear alkyl group include a methyl group, an ethyl group, a propyl group, a butyl group, a pentyl group, and a hexyl group, and examples of the branched alkyl group include an isopropyl group and an isobutyl group. The X is, for example, 3 or 4.

A specific example of the silicon compound represented by the chemical formula (1) can be a compound represented by the chemical formula (1'), wherein X is 3. In the chemical formula (1'), $R^1$ is the same as that in the chemical formula (1), and is, for example, a methyl group. When $R^1$ represents a methyl group, the silicon compound is tris(hydroxy) methylsilane. When X is 3, the silicon compound is, for example, trifunctional silane having three functional groups.

(1')

A specific example of the silicon compound represented by the chemical formula (1) can be a compound represented by the chemical formula (1'), wherein X is 4. In this case, the silicon compound is, for example, tetrafunctional silane having four functional groups.

The monomer silicon compound may be, for example, a hydrolysate of a silicon compound precursor. The silicon compound precursor is not limited as long as it can generate the silicon compound by hydrolysis, for example. A specific example of the silicon compound precursor can be a compound represented by the following chemical formula (2).

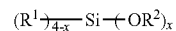
(2)

In the chemical formula (2), for example, X is 2, 3, or 4, $R^1$ and $R^2$ each represent a linear or a branched alkyl group, $R^1$ and $R^2$ may be identical to or different from each other, $R^1$s may be identical to or different from each other in the case where X is 2, and $R^2$s may be identical to or different from each other.

X and $R^1$ are the same as those in the chemical formula (1), for example. Regarding $R^2$, for example, reference can be made to the examples of $R^1$ in the chemical formula (1).

A specific example of the silicon compound precursor represented by the chemical formula (2) can be a compound represented by the chemical formula (2'), wherein X is 3. In the chemical formula (2'), $R^1$ and $R^2$ are the same as those in the chemical formula (2). When $R^1$ and $R^2$ both represent methyl groups, the silicon compound precursor is trimethoxy(methyl)silane (hereinafter, also referred to as "MTMS").

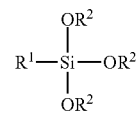
(2')

The monomer silicon compound is preferably the trifunctional silane because it is superior in the lowness of refractive index. Also, the monomer silicon compound is preferably the tetrafunctional silane because it is superior in strength (for example, abrasion resistance). Regarding the monomer silicon compounds which serve as the raw material of the gelled silicon compound, one kind of the compounds may be used alone or two or more kinds of them may be used in combination, for example. As a specific example, the monomer silicon compound may include only the trifunctional silane, only the tetrafunctional silane, or both of the trifunctional silane and the tetrafunctional silane, and may further include other silicon compounds, for example. When two or more kinds of silicon compounds are used as the monomer silicon compound, the ratio between the compounds is not particularly limited and can be determined appropriately.

The low refractive index layer of the present invention may contain a catalyst for chemically bonding one kind or two or more kinds of structural units that form a structure with minute void spaces, for example. The content of the catalyst is not particularly limited, and the content of the catalyst relative to the weight of the structural unit is, for example, 0.01 wt % to 20 wt %, 0.05 wt % to 10 wt %, or 0.1 wt % to 5 wt %.

The low refractive index layer of the present invention may further contain a crosslinking assisting agent for indirectly bonding one kind or two or more kinds of structural units that form a structure with minute void spaces, for example. The content of the crosslinking assisting agent is not particularly limited, and the content of the crosslinking assisting agent relative to the weight of the structural unit is, for example, 0.01 wt % to 20 wt %, 0.05 wt % to 15 wt %, or 0.1 wt % to 10 wt %.

The form of the low refractive index layer of the present invention is not limited to particular forms, and is normally in the form of a film.

The low refractive index layer of the present invention may be, for example, a roll. More specifically, for example, the present invention may further include a resin film, and the low refractive index layer may be formed on the long resin film. In this case, another long film may be stacked on the laminated film (laminate of the resin film and the low refractive index layer of the present invention). Specifically, another long resin film (for example, interleaving paper, release film, surface protection film, or the like) may be stacked on the laminated film including the resin film and the low refractive index layer, and then the obtained laminate may be wound in the form of a roll.

The method of producing a low refractive index layer of the present invention is not limited to particular methods, and the low refractive index layer of the present invention can be produced, for example, by the method described below (hereinafter, also referred to as the "production method of the present invention").

[1-3. Production Method of Low Refractive Index Layer]

The method of forming a low refractive index layer of the present invention preferably includes the steps of; preparing a liquid containing microporous particles; coating the liquid on a base (for example, resin film); and drying the liquid coated on the base, for example. The present invention, however, is not limited thereto. The liquid containing the microporous particles (hereinafter, also referred to as a "microporous particle-containing liquid") is not limited to particular liquids, and can be, for example, a suspension containing the microporous particles. The present invention is described below mainly with reference to an example in which the microporous particle is a pulverized product of a gelled compound and the low refractive index layer is a porous body (preferably, silicone porous body) containing pulverized products of a gelled compound. The present invention, however, can be performed in the same manner also in the case where the microporous particle is something other than the pulverized product of a gelled compound. In the production method of the laminated film roll of the present invention, the low refractive index layer is, for example, a porous body in which microporous particles are chemically bonded, and the microporous particles are chemically bonded in the low refractive index layer forming step. The microporous particle is, for example, a silicon compound microporous particle and the porous body is a silicone porous body. The silicon compound microporous particle includes, for example, a pulverized product of a gelled silica compound. Another embodiment of the low refractive index layer includes a void-provided layer including fibrous substances such as nanofiber, wherein the fibrous substances are entangled to form a layer with void spaces. The production method of a void-provided layer including fibrous substances is the same as that of the layer including microporous particles. Besides the aforementioned embodiment, the low refractive index layer includes a void-provided layer formed by using hollow nanoparticles and nanoclay, and a void-provided layer made by using hollow nanoballoons and magnesium fluoride. These low refractive index layers may be void-provided layers made of a single component or of multiple components. The void-provided layer may be the layer adopting one of the aforementioned embodiments or the layer adopting more than one of the aforementioned embodiments. The present invention is described below mainly with reference to the void-provided layer of a porous body in which the microporous particles are chemically bonded.

The production method of the present invention forms a low refractive index layer which is superior in the lowness of refractive index. With reference to the reason for this, the following theory can be formed. The present invention, however, is not limited thereto.

Since the pulverized product used in the production method of the present invention is obtained by pulverizing the gelled silicon compound, the three-dimensional structure of the gelled silicon compound before pulverization is dispersed into three-dimensional basic structures. In the production method of the present invention, the precursor having a porous structure based on the three-dimensional basic structures is formed by coating the pulverized products of a gelled silicon compound on the base. That is, according to the production method of the present invention, a new porous structure is formed of the pulverized products each having the three-dimensional basic structure, which is different from the three-dimensional structure of the gelled silicon compound. Thus, the finally obtained low refractive index layer brings about an effect of a low refractive index equivalent to an air layer, for example. Moreover, in the production method of the present invention, since the pulverized products are chemically bonded, the new three-dimensional structure is immobilized. Thus, the finally obtained low refractive index layer, despite its structure with void spaces, can maintain a sufficient strength and sufficient flexibility. The low refractive index layer obtained by the production method of the present invention is useful as a substitute for the air layer, in an aspect of low refractive index as well as in strength and flexibility, for example. With reference to an air layer, the air layer is formed between the components by stacking components with a space by providing a spacer or the like therebetween. The low refractive index layer obtained by the production method of the present invention can achieve a low refractive index equivalent to the air layer only by disposing it at a desired site, for example. Thus, as described above, the present invention can impart a low refractive index equivalent to the air layer to an optical element easier and simpler than forming the air layer.

Regarding the production method of the present invention, reference can be made to the description as to the low refractive index layer of the present invention, unless otherwise stated.

Regarding the gelled compound, the pulverized product thereof, the monomer compound, and the precursor of the monomer compound in the production method of the present invention, reference can be made to the description as to the porous structure of the present invention.

The production method of the present invention includes a step of preparing a microporous particle-containing liquid as described above, for example. When the microporous particle is a pulverized product of a gelled compound, the pulverized product can be obtained, for example, by pulverizing the gelled compound. By pulverization of the gelled compound, as described above, the three-dimensional structure of the gelled compound is destroyed and dispersed into three-dimensional basic structures.

Generation of the gelled compound by gelation of the monomer compound and preparation of the pulverized product by pulverization of the gelled compound are described below. The present invention, however, is not limited thereto.

The gelation of the monomer compound can be performed, for example, by bonding the monomer compounds by a hydrogen bond or an intermolecular bond.

The monomer compound can be, for example, a silicon compound represented by the chemical formula (1) described in the description as to the low refractive index layer of the present invention.

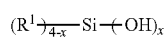
(1)

Since the silicon compound represented by the chemical formula (1) has a hydroxyl group, monomers in the chemical formula (1) can be bonded by a hydrogen bond or an intermolecular bond through their hydroxyl groups, for example.

The silicon compound may be the hydrolysate of the silicon compound precursor as described above, and may be generated by hydrolyzing the silicon compound precursor represented by the chemical formula (2) described in the description as to the low refractive index layer of the present invention, for example.

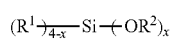
(2)

The method of hydrolyzing the monomer compound precursor is not limited to particular methods, and can be performed by a chemical reaction in the presence of a catalyst, for example. Examples of the catalyst include acids such as an oxalic acid and an acetic acid. The hydrolysis reaction can be performed, for example, by gradually dropping a solution of oxalic acid to a mixture (for example, suspension) of the silicon compound and dimethylsulfoxide to mix at room temperature, and stirring the resultant for about 30 minutes. In hydrolysis of the silicon compound precursor, for example, by completely hydrolyzing the alkoxy group of the silicon compound precursor, gelation and aging thereafter and heating and immobilization after formation of a void-provided structure can be achieved more efficiently.

The gelation of the monomer compound can be performed, for example, by a dehydration condensation reaction among the monomers. The dehydration condensation reaction is preferably performed in the presence of a catalyst, for example. Examples of the catalyst include dehydration condensation catalysts such as: acid catalysts including a hydrochloric acid, an oxalic acid, and a sulfuric acid; and base catalysts including ammonia, potassium hydroxide, sodium hydroxide, and ammonium hydroxide. The dehydration condensation catalyst is particularly preferably a base catalyst. In the dehydration condensation reaction, the amount of the catalyst to be added to the monomer compound is not particularly limited, and is, for example, 0.01 to 10 mol, 0.05 to 7 mol, or 0.1 to 5 mol per mol of the monomer compound.

The gelation of the monomer compound is preferably performed in a solvent, for example. The proportion of the monomer compound in the solvent is not particularly limited. Examples of the solvent include dimethylsulfoxide (DMSO), N-methylpyrrolidone (NMP), N,N-dimethylacetamide (DMAc), dimethylformamide (DMF), γ-butyrolactone (GBL), acetonitrile (MeCN), and ethylene glycol ethyl ether (EGEE). One kind of the solvents may be used alone or two or more kinds of them may be used in combination, for example. Hereinafter, the solvent used for the gelation is also referred to as a "gelation solvent".

The condition for the gelation is not limited to particular conditions. Regarding the treatment of the solvent containing the monomer compound, the treatment temperature is, for example, 20° C. to 30° C., 22° C. to 28° C., or 24° C. to 26° C., and the treatment time is, for example, 1 to 60 minutes, 5 to 40 minutes, or 10 to 30 minutes. The treatment condition for the dehydration condensation reaction is not limited to particular conditions, and reference can be made to these examples. By gelation, a siloxane bond is grown and silica primary particles are formed. As the reaction further proceeds, the primary particles are connected in the form of a string of beads to generate a gel having a three-dimensional structure, for example.

The gelled compound obtained by the gelation is preferably subjected to aging treatment after the gelation reaction. The aging treatment causes further growth of the primary particle of a gel having a three-dimensional structure obtained by gelation, for example, and this allows the size of the particle itself to be increased. As a result, the contact state of the neck where particles are in contact with one another can be increased from a point contact to a surface contact. The gel which has been subjected to the aging treatment increases its strength, for example, and this increases the strength of the three-dimensional basic structure after pulverization. This prevents, in the drying step after application of the pulverized product, the pore size of the void-provided structure obtained by deposition of the three-dimensional basic structures from shrinking in accordance with solvent volatilization during the drying process, for example.

The aging treatment can be performed, for example, by incubating the gelled compound at a predetermined temperature for a predetermined time. The predetermined temperature is not particularly limited, and the lower limit thereof is, for example, 30° C. or more, 35° C. or more, or 40° C. or more, the upper limit thereof is, for example, 80° C. or less, 75° C. or less, or 70° C. or less, and the predetermined temperature is, for example, in the range from 30° C. to 80° C., 35° C. to 75° C., or 40° C. to 70° C. The predetermined time is not particularly limited, and the lower limit is, for example, 5 hours or more, 10 hours or more, or 15 hours or more, the upper limit is, for example, 50 hours or less, 40 hours or less, or 30 hours or less, and the predetermined time is, for example, in the range from 5 hours to 50 hours, 10 hours to 40 hours, or 15 hours to 30 hours. An optimal condition for the aging is, for example, the condition mainly aiming for increase in the size of the silica primary particle and increase in the contact area of the neck. Furthermore, it is preferable to take the boiling point of a solvent to be used into consideration. For example, when the aging temperature is too high, there is a possibility that the solvent excessively volatilizes, which causes defectiveness such that the pore of the three-dimensional void-provided structure closes due to the condensation of the concentration of a coating liquid (gel liquid). On the other hand, for example, when the aging temperature is too low, there is a possibility not only that a sufficient effect of the aging is not brought about but also that temperature variations over time in a mass production process increase, which cause products with poor quality to be produced.

The same solvent as the solvent used in the gelation treatment can be used in the aging treatment, for example. Specifically, the aging treatment is preferably applied to a reactant (i.e., the solvent containing the gelled compound) after the gelation treatment. The mol number of residual silanol groups contained in the gel (the gelled compound, for example, the gelled silicon compound) after completion of the aging treatment after gelation is, for example, the proportion of the residual silanol group with the mol number of alkoxy groups of the added raw material (for example, the monomer compound precursor) being considered as 100, and the lower limit thereof is, for example, 1% or more, 3% or more, or 5% or more, the upper limit thereof is, for example, 50% or less, 40% or less, or 30% or less, and the mol number is, for example, in the range from 1% to 50%, 3% to 40%, or 5% to 30%. For the purpose of increasing the hardness of a gel, for example, the lower the mol number of the residual silanol groups, the better. When the mol number of the silanol groups is too high, for example, there is a possibility that the void-provided structure cannot be held until crosslinking is done in the precursors of the silicone porous body. On the other hand, when the mol number of the silanol groups is too low, for example, there is a possibility that the pulverized products of the gelled compound cannot be crosslinked in a step of preparing the microporous particle-containing liquid (for example, suspension) and/or subsequent steps, which hinders a sufficient film strength from being imparted. Note that while the aforementioned description is described with reference to a silanol group as an example, the same phenomenon shall be applied to various functional groups in the case where a monomer silicon compound is modified with various reactive functional groups, for example.

After gelation of the monomer compound in the gelation solvent, the obtained gelled compound is pulverized. The gelled compound in the gelation solvent may be pulverized as it is or the gelation solvent may be substituted with another solvent and the gelled compound in the substituted solvent may be pulverized, for example. Furthermore, if the catalyst and solvent used in the gelation reaction remain after the aging step, which causes gelation of the liquid over time (pot life) and decreases the drying efficiency in the drying step, it is preferable to substitute the gelation solvent with another solvent. Hereinafter, such a solvent for substitution may be also referred to as a "pulverization solvent".

The pulverization solvent is not limited to particular solvents, and can be, for example, an organic solvent. The organic solvent can be, for example, a solvent having a boiling point at 130° C. or less, 100° C. or less, or 85° C. or less. Specific examples of the organic solvent include isopropyl alcohol (IPA), ethanol, methanol, butanol, propylene glycol monomethyl ether (PGME), methyl cellosolve, acetone, and dimethylformamide (DMF). One kind of the pulverization solvents may be used alone or two or more kinds of them may be used in combination.

The combination of the gelation solvent and the pulverization solvent is not limited to particular combinations, and the combination can be, for example, the combination of DMSO and IPA, the combination of DMSO and ethanol, the combination of DMSO and methanol, and the combination of DMSO and butanol. Substitution of the gelation solvent with the pulverization solvent makes it possible to form a coating film with uniform quality in the coating film formation described below, for example.

The method of pulverizing the gelled compound is not limited to particular methods. Examples of the apparatus for pulverizing include: pulverizing apparatuses such as an ultrasonic homogenizer and a high-speed rotating homogenizer; pulverizing apparatuses utilizing other cavitation phenomena; and pulverizing apparatuses of causing oblique collision of liquids at a high pressure. An apparatus such as a ball mill that performs media pulverization physically destroys the void-provided structure of a gel in pulverization, for example. On the other hand, a cavitation-type pulverizing apparatus such as a homogenizer, which is preferable in the present invention, peels the contact surface of silica particles, which are already contained in a gel three-dimensional structure and bonded relatively weakly, with a high speed shearing force owing to a media-less method, for example. Thus, a sol three-dimensional structure to be obtained can hold a void-provided structure having a particle size distribution of a certain range and can form the void-provided structure again by deposition in coating and drying, for example. The condition for the pulverization is not limited to particular conditions, and is preferably a condition that allows a gel to be pulverized without volatilizing a solvent by instantaneously imparting a high speed flow, for example. For example, it is preferable to pulverize the gelled silicon compound so as to obtain pulverized products having the above-described particle size variations (for example, volume average particle size or particle size distribution). If the pulverization time, the pulverization strength, or the like is lacking, for example, there is a possibility not only that coarse particles remain, which hinders dense pores from being formed but also that defects in appearance increase, which hinders high quality from being achieved. On the other hand, if the pulverization time, the pulverization strength, or the like is too much, for example, there is a possibility that a finer sol particle than a desired particle size distribution is obtained and the size of a void space deposited after coating and drying is too fine to satisfy a desired porosity.

In the manner described above, a microporous particle-containing liquid (for example, suspension) can be prepared. By further adding a catalyst for chemically bonding the microporous particles after or during the preparation of the microporous particle-containing liquid, a liquid containing the microporous particles and the catalyst can be prepared. The amount of the catalyst to be added is not particularly limited, and the amount of the catalyst to be added relative to the weight of the microporous particle (pulverized product of the gelled silicon compound) is, for example, in the range from 0.01 wt % to 20 wt %, 0.05 wt % to 10 wt %, or 0.1 wt % to 5 wt %. This catalyst chemically bonds the microporous particles in the bonding step described below, for example. The catalyst may be, for example, a catalyst that promotes the crosslinking bond among the microporous particles. As the chemical reaction of chemically bonding the microporous particles, it is preferable to utilize the dehydration condensation reaction of a residual silanol group contained in a silica sol molecule. By promoting the reaction between the hydroxyl groups of the silanol group by the catalyst, the continuous formation of a film in which the void-provided structure is cured in a short time can be performed. Examples of the catalyst include photoactive catalysts and thermoactive catalysts. The photoactive catalyst allows the chemical bond (for example, crosslinking bond) among the microporous particles without heating, for example. This makes it possible to maintain a higher proportion of void space because the shrinkage due to heating is less liable to occur, for example. In addition to or instead of the catalyst, a substance (catalyst generator) that generates a catalyst may be used. For example, the catalyst may be a crosslinking reaction accelerator and the catalyst generator may be a substance that generates the crosslinking reaction accelerator. For example, in addition to or instead of the photoactive catalyst, a substance (photocatalyst generator) that generates a catalyst by light irradiation may be used. For example, in addition to or instead of the thermoactive catalyst, a substance (thermal catalyst generator) that generates a catalyst by heating may be used. The photocatalyst generator is not limited to particular photocatalyst generators, and examples thereof include photobase generators (substances that generate basic catalysts by light irradiation) and photoacid generators (substances that generate acidic catalysts by light irradiation). Among them, the photobase generator is preferable. Examples of the photobase generator include 9-anthrylmethyl N,N-diethylcarbamate (product name: WPBG-018), (E)-1-[3-(2-hydroxyphenyl)-2-propenoyl]piperidine (product name: WPBG-027), 1-(anthraquinon-2-yl)ethyl imidazolecarboxylate (product name: WPBG-140), 2-nitrophenylmethyl 4-methacryloyloxypiperidine-1-carboxylate (product name: WPBG-165), 1,2-diisopropyl-3-[bis(dimethylamino)methylene]guanidium 2-(3-benzoylphenyl)propionate (product name: WPBG-266), 1,2-dicyclohexyl-4,4,5,5-tetramethylbiguanidium n-butyltriphenylborate (product name: WPBG-300), 2-(9-oxoxanthen-2-yl)propionic acid 1,5,7-triazabicyclo[4.4.0]dec-5-ene (Tokyo Kasei Kogyo Co., Ltd.), and a compound containing 4-piperidinemethanol (product of Heraeus, product name: HDPD-PB100). Note that each product with the name including "WPBG" is a product of Wako Pure Chemical Industries, Ltd. Examples of the photoacid generator include aromatic sulfonium salt (product of ADEKA, product name: SP-170), triarylsulfonium salt (product of San-Apro Ltd., product name: CPI101A), and aromatic iodonium salt (product of Ciba Japan, product name: Irgacure 250). The catalyst for chemically bonding the microporous particles is not limited to the photoactive catalyst, and can be, for example, a thermoactive catalyst such as urea. Examples of the catalyst for chemically bonding the microporous particles include base catalysts such as potassium hydroxide, sodium hydroxide, and ammonium hydroxide; and acid catalysts such as a hydrochloric acid, an acetic acid, and an oxalic acid. Among them, the base catalyst is preferable. The catalyst for chemically bonding the microporous particles can be used by adding it to a sol particle liquid (for example, suspension) containing the pulverized products (microporous particles) right before the coating, or the catalyst can be used as a mixture by mixing it with a solvent, for example. The mixture may be, for example, a coating liquid obtained by adding the catalyst directly to the sol particle liquid, a solution obtained by dissolving the catalyst in a solvent, or a dispersion liquid obtained by dispersing the catalyst into a solvent. The solvent is not limited to particular solvents, and examples thereof include various organic solvents, water, and buffer solutions.

For example, in the case where the microporous particle is a pulverized product of a gelled silicon compound obtained from a silicon compound containing at least trifunctional or less functional groups having saturated bonds, a crosslinking assisting agent for indirectly bonding the microporous particles may further be added after or during preparation of the microporous particle-containing liquid. This crosslinking assisting agent penetrates among particles and interacts with or bonds to the particles, which helps to bond particles relatively distanced from one another and makes it possible to increase the strength efficiently. As the crosslinking assisting agent, a multi-crosslinking silane monomer is preferable. Specifically, the multi-crosslinking silane monomer may have at least two and at most three alkoxysilyl groups, the chain length between the alkoxysilyl groups may be 1-10C, and the multi-crosslinking silane monomer may contain an element other than carbon, for example. Examples of the crosslinking assisting agent include bis(trimethoxysilyl)ethane, bis(triethoxysilyl)ethane, bis(trimethoxysilyl)methane, bis(triethoxysilyl)methane, bis(triethoxysilyl)propane, bis(trimethoxysilyl)propane, bis(triethoxysilyl)butane, bis(trimethoxysilyl)butane, bis(triethoxysilyl)pentane, bis(trimethoxysilyl)pentane, bis(triethoxysilyl)hexane, bis(trimethoxysilyl)hexane, bis(trimethoxysilyl)-N-butyl-N-propyl-ethane-1,2-diamine, tris-(3-trimethoxysilylpropyl)isocyanurate, and tris-(3-triethoxysilylpropyl)isocyanurate. The amount of the crosslinking assisting agent to be added is not particularly limited, and the amount of the crosslinking assisting agent to be added relative to the weight of the silicon compound microporous particle is, for example, in the range from 0.01 wt % to 20 wt %, 0.05 wt % to 15 wt %, or 0.1 wt % to 10 wt %.

The production method of the present invention includes a step of coating the microporous particle-containing liquid (for example, suspension) on a resin film as described above. The coating can be performed, for example, by the various coating methods described below but is not limited thereto. By directly coating the solvent containing the pulverized products on the base, the precursor of the porous body (coating film) can be formed. The precursor of the porous body can also be referred to as a coating layer, for example. The precursor of the porous body, which is the precursor of the porous body before the bonding step described below, can be also referred to as a precursor film (or precursor layer) of the low refractive index layer of the present invention, for example. Formation of the precursor (coating film) of the porous body causes the settlement and deposition of the pulverized product whose three-dimensional structure has been destroyed, for example, and this allows a new three-dimensional structure to be formed.

The solvent (hereinafter, also referred to as a "coating solvent") is not limited to particular solvents, and can be, for example, an organic solvent. The organic solvent can be, for example, a solvent having a boiling point at 130° C. or less. Specific examples of the solvent include IPA, ethanol, methanol, and butanol, and the examples of the pulverization solvent described above can be used. In the case where the present invention includes a step of pulverizing the gelled compound, for example, the pulverization solvent containing the pulverized products of the gelled compound can be used as it is in the step of forming the precursor of the porous body.

In the coating step, for example, it is preferable to coat the sol pulverized products dispersed in the solvent (hereinafter, also referred to as a "sol particle liquid") on the base. After coating and drying the sol particle liquid of the present invention, by chemically crosslinking the particles in the bonding step, the continuous formation of a void-provided layer having a film strength of a certain level or more can be performed. The "sol" in the present invention denotes a fluidic state in which silica sol particles each having a nano three-dimensional structure holding a part of the void-provided structure are dispersed in a solvent by pulverization of the three-dimensional structure of a gel.

The concentration of the pulverized product in the solvent is not particularly limited, and is, for example, in the range from 0.3% to 50% (v/v), 0.5% to 30% (v/v), or 1.0% to 10%

(v/v). When the concentration of the pulverized product is too high, there is a possibility that the fluidity of the sol particle liquid decreases significantly, which causes aggregates and coating stripes in coating, for example. On the other hand, when the concentration of the pulverized product is too low, there is a possibility not only that the drying of the sol particle solvent takes a relatively long time but also that the residual solvent right after the drying increases, which may decrease the porosity, for example.

There is no particular limitation on the physical property of the sol. The shear viscosity of the sol is, for example, 100 cPa·s or less, 10 cPa·s or less, or 1 cPa·s or less, for example, at the shear rate of 1000l/s. When the shear viscosity is too high, for example, there is a possibility that the coating stripes are generated, which causes defectiveness such as decrease in the transfer rate in the gravure coating. In contrast, when the shear viscosity is too low, for example, there is a possibility that the thickness of the wet coating during coating cannot be increased and a desired thickness cannot be obtained after drying.

The coating amount of the pulverized product relative to the base is not particularly limited, and can be determined appropriately, for example, according to the thickness of a desired silicone porous body. As a specific example, in the case of forming the silicone porous body having a thickness of 0.1 to 1000 μm, the coating amount of the pulverized product to the base is, for example, in the range from 0.01 to 60000 μg, 0.1 to 5000 μg, or 1 to 50 μg per square meter of the base. Although it is difficult to uniquely define a preferable coating amount of the sol particle liquid because it depends on the concentration of a liquid, the coating method, or the like, for example, it is preferable that a coating layer is as thin as possible in consideration of productivity. When the coating amount is too much, for example, there is a high possibility that a solvent is dried in a drying oven before volatilizing. When the solvent is dried before forming the void-provided structure by the settlement and deposition of the nano pulverized sol particles in the solvent, there is a possibility that formation of void spaces is inhibited and the proportion of void space decreases. On the other hand, when the coating amount is too little, there is a possibility of increasing the risk of causing coating cissing due to unevenness of a base, variations in hydrophilicity and hydrophobicity, and the like.

Furthermore, for example, the production method of the present invention includes a step of drying the coated microporous particle-containing liquid (precursor of porous body (coating film)) as described above. The drying treatment is aimed not only for removing the solvent (solvent contained in the sol particle liquid) from the precursor of the porous body but also for causing the settlement and deposition of the sol particles to form a void-provided structure in the drying treatment, for example. The temperature for the drying treatment is, for example, in the range from 50° C. to 250° C., 60° C. to 150° C., or 70° C. to 130° C., and the time for the drying treatment is, for example, in the range from 0.1 to 30 minutes, 0.2 to 10 minutes, or 0.3 to 3 minutes. Regarding the temperature and time for the drying treatment in relation to continuous productivity and the expression of high porosity, the lower the better and the shorter the better, for example. When the condition is too strict, there is a possibility of causing the following problems, for example. That is, when the base is a resin film, for example, the base extends in a drying oven as the temperature approaches the glass-transition temperature of the base, which causes defects such as cracks in a formed void-provided structure right after coating. On the other hand, when the condition is too mild, there is a possibility of causing the following problems, for example. That is, since the film contains a residual solvent when it comes out of the drying oven, defects in appearance such as scratches are caused when the film rubs against a roller in the next step.

The drying treatment may be, for example, natural drying, drying by heating, or drying under reduced pressure. The drying method is not limited to particular methods, and a common heating unit can be used, for example. Examples of the heating unit include a hot air fan, a heating roller, and a far-infrared heater. Among them, in view of performing continuous production industrially, drying by heating is preferable. The solvent to be used is preferably a solvent having a low surface tension in view of reducing the shrinkage stress in accordance with the solvent volatilization in drying and reducing the crack phenomenon of the void-provided layer (the silicone porous body) due to the shrinkage stress. The solvent can be, for example, lower alcohol typified by isopropyl alcohol (IPA), hexane, perfluorohexane, and the like. The solvent, however, is not limited thereto. The surface tension may be reduced by adding a small amount of a perfluoro surfactant or a small amount of a silicon surfactant to the IPA and the like.

According to the production method of the present invention, the three-dimensional structure of the pulverized product in the precursor of the porous body is immobilized, for example. In the case of immobilizing the three-dimensional structure by conventional sintering, for example, the dehydration condensation of a silanol group and the formation of a siloxane bond are induced by high temperature treatment at 200° C. or more. In the present invention, for example, when a base is a resin film, the void-provided structure can be formed and immobilized continuously at about 100° C. which is relatively low for less than several minutes which is short without damaging the base by causing various additives, which catalyze the dehydration condensation reaction, to react.

The method of chemically bonding the particles is not limited to particular methods, and can be determined appropriately according to the kind of the gelled silicon compound, for example. Specifically, for example, the chemical bond can be a chemical crosslinking bond among the pulverized products. Besides this, for example, when inorganic particles such as titanium oxide particles are added to the pulverized products, the inorganic particles and the pulverized products can be chemically bonded by crosslinking. Furthermore, there are a case of using a biocatalyst such as an enzyme and a case of chemically crosslinking the pulverized product and a catalyst at a site which is different from a catalytic activity site. Thus, the present invention can be applied not only to a void-provided layer (silicone porous body) formed of the sol particles but also to an organic-inorganic hybrid void-provided layer, a host-guest void-provided layer, and the like, for example. The present invention, however, is not limited thereto.

The bonding can be carried out by a chemical reaction of chemically bonding the pulverized products (microporous particles) in the presence of a catalyst according to the kind of the pulverized product of the gelled compound, for example. The catalyst may be a catalyst for promoting the crosslinking bond among microporous particles, for example. The chemical reaction in the present invention is preferably a reaction utilizing a dehydration condensation reaction of a residual silanol group contained in a silica sol molecule. By promoting the reaction between the hydroxyl groups of the silanol group by the catalyst, the continuous formation of a film in which the void-provided structure is cured in a short time can be performed. Examples of the catalyst include base catalysts such as potassium hydroxide, sodium hydroxide, and ammonium hydroxide; and acid catalysts such as a hydrochloric acid, an acetic acid, and an oxalic acid. The catalyst, however, is not limited thereto. The catalyst used in the dehydration condensation reaction is preferably a base catalyst. Furthermore, photoacid generation catalysts, photobase generation catalysts, photoacid generators, photobase generators, and the like, each of which expresses a catalytic activity by light (for example, ultraviolet) irradiation, may preferably be used. The photoacid generation catalysts, photobase generation catalysts, photoacid generators, and photobase generators are not limited to particular catalysts, and can be, for example, as described above. The catalyst can be added to the microporous particle-containing liquid (for example, suspension of the pulverized products (microporous particles)), for example, in the step of preparing the liquid as described above. More specifically, preferably, the catalyst is used by adding it to a sol particle liquid (for example, suspension) containing the pulverized products (microporous particles) right before the coating or the catalyst is used as a mixture by mixing it with a solvent, for example. The mixture may be, for example, a coating liquid obtained by adding the catalyst directly to the sol particle liquid, a solution obtained by dissolving the catalyst in a solvent, or a dispersion liquid obtained by dispersing the catalyst into a solvent. The solvent is not limited to particular solvents as described above, and examples thereof include water, and buffer solutions.

It is not particularly limited at which stage the chemical reaction in the presence of the catalyst is performed (caused) in the production method of the present invention. The chemical reaction can be performed, for example, by heating the coating film containing the catalyst preliminarily added to the sol particle liquid (for example, suspension) or irradiating the coating film containing the catalyst preliminarily added to the sol particle liquid with light, by heating the coating film or irradiating the coating film with light after the catalyst has been sprayed to the coating film, or by heating the coating film or irradiating the coating film with light while spraying the catalyst to the coating film. For example, when the catalyst is a photoactive catalyst, the low refractive index layer can be formed by chemically bonding the microporous particles by light irradiation. When the catalyst is a thermoactive catalyst, the low refractive index layer can be formed by chemically bonding the microporous particles by heating. The accumulated light amount in the light irradiation is not particularly limited, and is, for example, in the range from 200 to 800 mJ/cm$^2$, 250 to 600 mJ/cm$^2$, or 300 to 400 mJ/cm$^2$ in terms of the wavelength at 360 nm. From the viewpoint of preventing the effect from being insufficient due to the delay of decomposition of the catalyst generator by light absorption because of insufficient irradiation amount, the accumulated light amount is preferably 200 mJ/cm$^2$ or more. From the viewpoint of preventing heat wrinkles from generating due to the damage on a base below a void-provided layer, the accumulated light amount is preferably 800 mJ/cm$^2$ or less. The conditions for the heat treatment are not limited to particular conditions. The heating temperature is, for example, 50° C. to 250° C., 60° C. to 150° C., or 70° C. to 130° C., and the heating time is, for example, 0.1 to 30 minutes, 0.2 to 10 minutes, or 0.3 to 3 minutes. The step of drying the coated sol particle liquid (for example, suspension) may also serve as a step of performing a chemical reaction in the presence of the catalyst. That is, in the step of drying the sol particle liquid (for example, suspension), the pulverized products (microporous particles) may be chemically bonded in the presence of the catalyst. In this case, by further heating the coating film after the drying step, the pulverized products (microporous particles) may be bonded more firmly. It is presumed that the chemical reaction in the presence of the catalyst may be caused also in the step of preparing the microporous particle-containing liquid (for example, suspension) and the step of coating the microporous particle-containing liquid. This presumption, however, does not limit the present invention by any means. The solvent to be used is preferably a solvent having a low surface tension in view of reducing the shrinkage stress in accordance with the solvent volatilization in drying and reducing the crack phenomenon of the void-provided layer due to the shrinkage stress, for example. The solvent can be, for example, lower alcohol typified by isopropyl alcohol (IPA), hexane, perfluorohexane, or the like. The solvent, however, is not limited thereto.

In the manner described above, the low refractive index layer of the present invention can be produced. The production method of the present invention, however, is not limited thereto.

The thus obtained low refractive index layer of the present invention may be subjected to a strength increasing step (hereinafter, also referred to as an "aging step") of applying thermal aging to increase the strength, for example. For example, when the low refractive index layer of the present invention is stacked on a resin film, the peel strength to the resin film can be increased by the strength increasing step (aging step). In the strength increasing step (aging step), for example, the low refractive index layer of the present invention may be heated. The temperature of the aging step is, for example, 40° C. to 80° C., 50° C. to 70° C., or 55° C. to 65° C. The time for the reaction is, for example, 5 to 30 hours, 7 to 25 hours, or 10 to 20 hours. By setting the heating temperature low in the aging step, for example, the peel strength can be increased while reducing the shrinkage of the low refractive index layer, thereby achieving both a high proportion of void space and strength.

While the phenomenon and mechanism caused in the strength increasing step (aging step) are unknown, for example, it is considered that the catalyst contained in the low refractive index layer of the present invention promotes the chemical bond (for example, crosslinking reaction) among the microporous particles, thereby increasing the strength. As a specific example, when the microporous particles are silicon compound microporous particles (for example, pulverized products of a gelled silica compound) and residual silanol groups (OH groups) are present in the low refractive index layer, it is considered that the residual silanol groups are chemically bonded by a crosslinking reaction. The catalyst contained in the low refractive index layer of the present invention is not limited to particular catalysts, and can be, for example, a catalyst used in the bonding step, a basic substance generated from the photobase generation catalyst used in the bonding step by light irradiation, or an acidic substance generated from the photoacid generation catalyst used in the bonding step by light irradiation. The description, however, is illustrative and does not limit the present invention.

A pressure-sensitive adhesive/adhesive layer may additionally be formed on the low refractive index layer of the present invention (pressure-sensitive adhesive/adhesive layer forming step). Specifically, for example, the pressure-sensitive adhesive/adhesive layer may be formed by applying (coating) a pressure-sensitive adhesive or an adhesive to the low refractive index layer of the present invention. The pressure-sensitive adhesive/adhesive layer may be formed on the low refractive index layer of the present invention using an adhesive tape in which the pressure-sensitive adhesive/adhesive layer is formed on a base by laminating the pressure-sensitive adhesive/adhesive layer side of the adhesive tape on the low refractive index layer of the present invention. In this case, the base of the adhesive tape may be kept remained or peeled from the pressure-sensitive adhesive/adhesive layer. In the present invention, a "pressure-sensitive adhesive" and a "pressure-sensitive adhesive layer" are used based on the premise that an adherend is re-peelable, for example. In the present invention, an "adhesive" and an "adhesive layer" are used based on the premise that an adherend is not re-peelable, for example. In the present invention, however, the "pressure-sensitive adhesive" and the "adhesive" are not always distinguishable and the "pressure-sensitive adhesive layer" and the "adhesive layer" are not always distinguishable. In the present invention, there is no particular limitation on the pressure-sensitive adhesives or the adhesives for forming the pressure-sensitive adhesive/adhesive layer, and a common pressure-sensitive adhesive or adhesive can be used, for example. Examples of the pressure-sensitive adhesive and the adhesive include polymer adhesives such as acrylic adhesives, vinyl alcohol adhesives, silicone adhesives, polyester adhesives, polyurethane adhesives, and polyether adhesives; and rubber adhesives. Furthermore, the pressure-sensitive adhesive and the adhesive can be an adhesive including a water-soluble crosslinking agent of vinyl alcohol polymer such as glutaraldehyde, melamine, or an oxalic acid. One kind of the pressure-sensitive adhesives and adhesives may be used alone or two or more kinds of them may be used in combination (for example, mixing, lamination, and the like). The thickness of the pressure-sensitive adhesive/adhesive layer is not particularly limited, and is, for example, 0.1 to 100 μm, 5 to 50 μm, 10 to 30 μm, or 12 to 25 μm.

Furthermore, an intermediate layer may be formed between the low refractive index layer of the present invention and the pressure-sensitive adhesive/adhesive layer by causing the low refractive index layer of the present invention to react with the pressure-sensitive adhesive/adhesive layer (intermediate layer forming step). Owing to the intermediate layer, the low refractive index layer of the present invention and the pressure-sensitive adhesive/adhesive layer are not easily peeled from each other, for example. While the reason (mechanism) for this is unknown, it is presumed that the low refractive index layer of the present invention and the pressure-sensitive adhesive/adhesive layer are not easily peeled from each other owing to the anchoring property (anchor effect) of the intermediate layer, for example. The anchoring property (anchor effect) is a phenomenon (effect) that the interface between the void-provided layer and the intermediate layer is strongly fixed because the intermediate layer is entangled in the void-provided layer in the vicinity of the interface. This reason (mechanism), however, is an example of a presumable reason (mechanism), and does not limit the present invention. The reaction between the low refractive index layer of the present invention and the pressure-sensitive adhesive/adhesive layer is not limited to particular reactions, and can be, for example, a reaction by catalysis. The catalyst may be a catalyst contained in the low refractive index layer of the present invention, for example. Specifically, the catalyst can be, for example, a catalyst used in the bonding step, a basic substance generated from the photobase generation catalyst used in the bonding step by light irradiation, or an acidic substance generated from the photoacid generation catalyst used in the bonding step by light irradiation. The reaction between the low refractive index layer of the present invention and the pressure-sensitive adhesive/adhesive layer may be, for example, a reaction (for example, crosslinking reaction) that generates a new chemical bond. The temperature of the reaction is, for example, 40° C. to 80° C., 50° C. to 70° C., or 55° C. to 65° C. The time for the reaction is, for example, 5 to 30 hours, 7 to 25 hours, or 10 to 20 hours. This intermediate layer forming step may also serve as the strength increasing step (aging step) of increasing the strength of the low refractive index layer of the present invention.

The thus obtained low refractive index layer of the present invention may further be stacked on another film (layer) to form a laminate having the porous structure, for example. In this case, the components of the laminate may be stacked through a pressure-sensitive adhesive or an adhesive, for example.

The components may be stacked by continuous treatment (so called Roll to Roll) using a long film, for example, in terms of efficiency. When the base is a molded product, an element, or the like, the base that has been subjected to a batch process may be stacked.

[1-4. Production Method of Flexible Light-Emitting Device]

The method of producing a flexible light-emitting device of the present invention is described with reference to examples using FIGS. 2 to 5. Note that, in FIGS. 2 to 5, identical parts to those shown in FIG. 1 are indicated with identical numerals and symbols.

Figure 2:
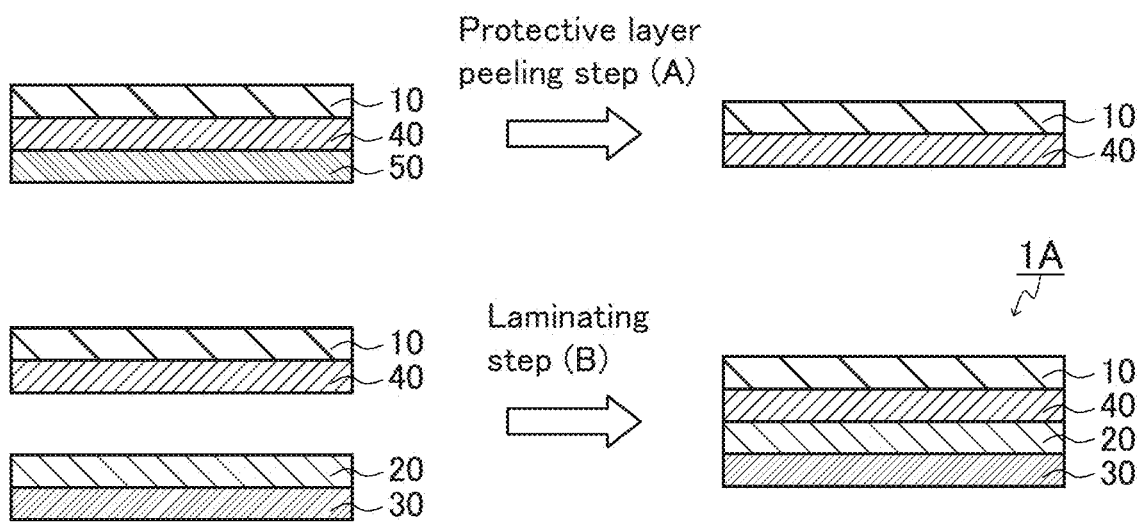
FIG. 2 is a process cross sectional view schematically showing an example of the process of producing the flexible light-emitting device of the present invention.

The cross sectional view of FIG. 2 schematically shows an example of the process of producing the flexible light-emitting device of the present invention. First, as shown in FIG. 2, a laminate with a pressure-sensitive adhesive/adhesive layer (hereinafter, also referred to as a "pressure-sensitive adhesive/adhesive layer-provided laminate") is provided. In the laminate, a pressure-sensitive adhesive/adhesive layer 40 is stacked on a light-emitting layer 10, and the pressure-sensitive adhesive/adhesive layer 40 is covered with a protective layer (separator) 50.

In FIG. 2, details of the light-emitting layer 10 are not shown for simplification. The pressure-sensitive adhesive/adhesive layer 40 is stacked on the light-emitting layer 10 on the side where a low refractive index layer 20 and a high refractive index layer 30 are to be stacked in FIG. 2. For example, in the case where the low refractive index layer 20 and the high refractive index layer 30 are stacked on the base 11 on the side opposite that where a first electrode 12, an organic EL layer (light-emitting layer) 13, and a second electrode 14 are stacked as in the case of the flexible light-emitting device 1 shown in FIG. 1, the pressure-sensitive adhesive/adhesive layer 40 is stacked on the base 11 on the side opposite that where the first electrode 12, the organic EL layer (light-emitting layer) 13, and the second electrode 14 are stacked. The method of producing the light-emitting layer 10 is not limited to particular methods as long as the first electrode 12, the organic EL layer (light-emitting layer) 13, and the second electrode 14 are formed on the base 11 in this order by the above-described method, for example.

Subsequently, as shown in FIG. 2, a protective layer peeling step (A) of peeling the protective layer 50 from a pressure-sensitive adhesive/adhesive layer is performed. Thereby, a pressure-sensitive adhesive/adhesive layer-provided laminate, in which the pressure-sensitive adhesive/adhesive layer 40 is stacked on the light-emitting layer 10, having no protective layer so that a pressure-sensitive adhesive is exposed can be obtained. Note that, in the present invention, the protective layer peeling step (A) is optional, and a pressure-sensitive adhesive/adhesive layer-provided laminate, in which the pressure-sensitive adhesive/adhesive layer 40 is stacked on the light-emitting layer 10, having no protective layer in the first place so that a pressure-sensitive adhesive is exposed may be provided. On the other hand, as shown in FIG. 2, a laminate in which the low refractive index layer 20 is stacked on the high refractive index layer 30 is provided. The high refractive index layer 30 is not limited to particular layers, and examples thereof include metal plates, metallic foil, resin plates, resin films, and flexible glass as described above. Then, a laminating step (B) of laminating the pressure-sensitive adhesive/adhesive side of the pressure-sensitive adhesive/adhesive layer-provided laminate, in which the pressure-sensitive adhesive/adhesive layer 40 is stacked on the light-emitting layer 10, on the low refractive index layer 20 is performed. Thereby, a flexible light-emitting device 1A of the present invention can be obtained. As shown in FIG. 2, in the flexible light-emitting device 1A, the low refractive index layer 20, the pressure-sensitive adhesive/adhesive layer 40, and the light-emitting layer 10 are stacked on the high refractive index layer 30 in this order.

Figure 3A:
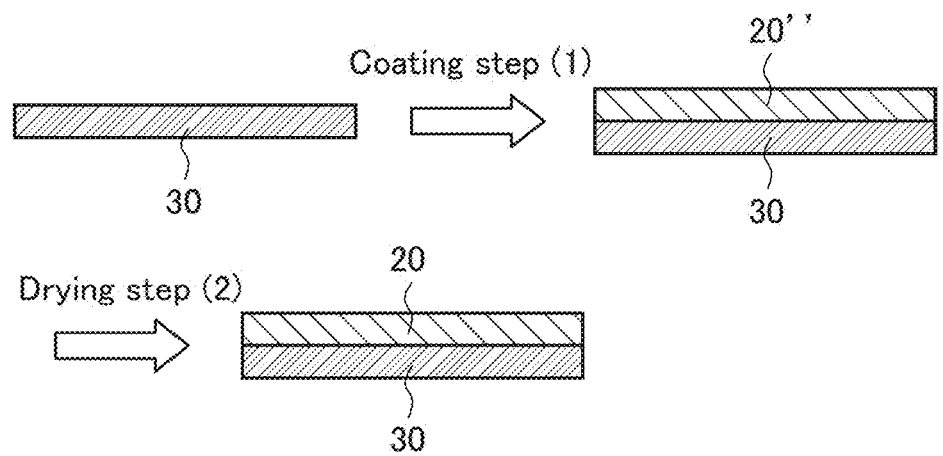
FIGS. 3A and 3B are process cross sectional views each schematically showing an example of the method of forming a low refractive index layer 20 on a high refractive index layer 30.
Figure 3B:
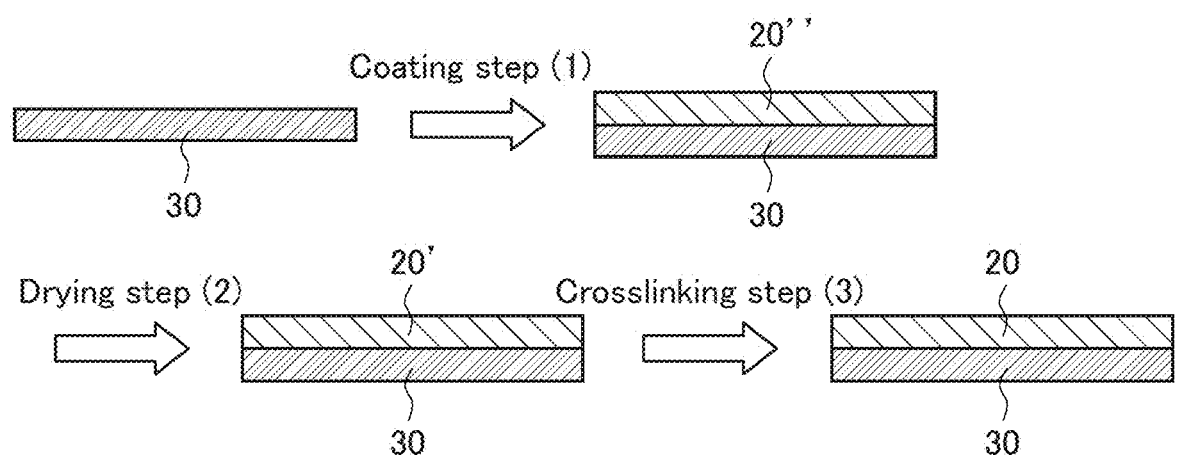

A laminate in which the low refractive index layer 20 is stacked on the high refractive index layer 30 can be produced, for example, by the production method shown in the process cross sectional view of FIG. 3A or FIG. 3B. As shown in the production method shown in FIG. 3A, a low refractive index layer with a base in which the low refractive index layer 20 is stacked on the high refractive index layer 30 can be produced by a coating step (1) of coating a sol particle liquid 20″ containing pulverized products of a gelled compound on the high refractive index layer 30 and a coating film forming step (drying step) (2) of drying the sol particle liquid 20″ to form the low refractive index layer 20. On the other hand, the production method shown in FIG. 3B further includes a chemical treatment step (3). Specifically, the production method includes, as shown in FIG. 3B, a coating step (1) of coating the sol particle liquid 20″ containing pulverized products of a gelled compound on the high refractive index layer 30, a coating film forming step (drying step) (2) of drying the sol particle liquid 20′ to form a coating film 20′ which is the precursor layer of the low refractive index layer, and a chemical treatment step (for example, crosslinking treatment step) (3) of applying chemical treatment (for example, crosslinking treatment) to the coating 20′ to form the low refractive index layer 20. In this manner, as shown in FIGS. 3A and 3, the low refractive index layer 20 can be formed on the high refractive index layer 30. Note that the lowness of the refractive index and the height (level) of the film strength are sometimes in the relationship of trade-off. Decision of whether or not to perform the chemical treatment step (for example, crosslinking step) (3) may be made in consideration of this point. For example, after forming the low refractive index layer 20 by the drying step (2) as shown in FIG. 3A, the low refractive index layer 20 may be protected by covering it with a resin film or the like (not shown). This allows continuous production without damaging the low refractive index layer 20 not requiring increase in the strength of the low refractive index layer 20 by the chemical treatment step (crosslinking step) (3), for example. Note that the resin film for covering the low refractive index layer 20 for protection may be peeled from the low refractive index layer 20 right before the laminating step (B), for example.

In the coating step (1), the method of coating the sol particle liquid 20″ is not limited to particular methods, and a common method can be adopted. Examples of the method include a slot die method, a reverse gravure coating method, a micro-gravure method (micro-gravure coating method), a dip method (dip coating method), a spin coating method, a brush coating method, a roller coating method, a flexography method, a wire-bar coating method, a spray coating method, an extrusion coating method, a curtain coating method, and a reverse coating method. Among them, from the viewpoint of productivity, smoothness of a coating film, and the like, an extrusion coating method, a curtain coating method, a roller coating method, a micro-gravure coating method, and the like are preferable. The coating amount of the sol particle liquid 20″ is not particularly limited, and can be determined appropriately so as to obtain a low refractive index layer 20 having an appropriate thickness, for example. The thickness of the low refractive index layer 20 is not particularly limited, and, for example, reference can be made to the above-described description.

In the drying step (2), the sol particle liquid 20″ is dried (i.e., dispersion medium contained in sol particle liquid 20″ is removed) to form a coating film (precursor layer) 20′. There is no particular limitation on the condition for the drying treatment, and reference can be made to the above-described description.

In the chemical treatment step (3), the coating film 20′ containing the catalyst (for example, photoactive catalyst or thermoactive catalyst such as KOH) which has been added before coating is irradiated with light or heated to chemically bond (for example, crosslink) the pulverized products in the coating film 20′, thereby forming a low refractive index layer 20. The conditions for the light irradiation and heating in the chemical treatment step (3) are not limited to particular conditions, and reference can be made to the above-described description. By using the resin film as the high refractive index layer 30, the low refractive index layer 20 can be stacked directly on the resin film (high refractive index layer 30), for example.

The method of forming a low refractive index layer may or may not include steps other than the steps (1) to (3) appropriately. For example, after the chemical treatment step (for example, crosslinking treatment step) (3) of forming the low refractive index layer 20, a strength improving step (aging step) (4) may be performed. In the strength improving step (aging step) (4), the strength of the low refractive index layer 20 is increased to form a low refractive index layer with improved strength. The strength improving step (aging step) (4) is not particularly limited, and, for example, reference can be made to the above-described description. For example, as shown in FIG. 2, the laminating step (B) of laminating the pressure-sensitive adhesive/adhesive layer 40 on the low refractive index layer 20 may be performed, and an intermediate layer forming step (5) of causing the low refractive index layer 20 to react with the pressure-sensitive adhesive/adhesive layer 40 to form an intermediate layer (not shown) may be performed after the laminating step (B). Note that the laminating step may be performed after the drying step (2) or the chemical treatment step (3), for example. The intermediate layer forming step (5) may also serve as a step of improving the strength of the low refractive index layer 20 (strength improving step), for example. The intermediate layer forming step (5) is not particularly limited, and, for example, reference can be made to the above-described description. The lowness of the refractive index and the height (level) of the film strength, as described above, are sometimes in the relationship of trade-off. Decision of whether or not to perform the strength improving step (aging step) (4) and the intermediate layer forming step (5) may be made in consideration of this point. For example, in the method of producing a laminated film of the present invention, as described above, the low refractive index layer is less liable to be damaged even if the film strength of the low refractive index layer is low, so that the strength improving step (aging step) (4) and the intermediate layer forming step (5) are sometimes not needed to be performed. For example, after forming the low refractive index layer 20 by the drying step (2) or the chemical treatment step (3), the low refractive index layer 20 may be protected by covering it with a resin film or the like (not shown). This allows continuous production without damaging the low refractive index layer 20 not requiring increase in the strength of the low refractive index layer 20 by the strength improving step (aging step) (4) and the intermediate layer forming step (5), for example. Note that the resin film for covering the low refractive index layer 20 for protection may be peeled from the low refractive index layer 20 right before the laminating step (B), for example.

Figure 4:
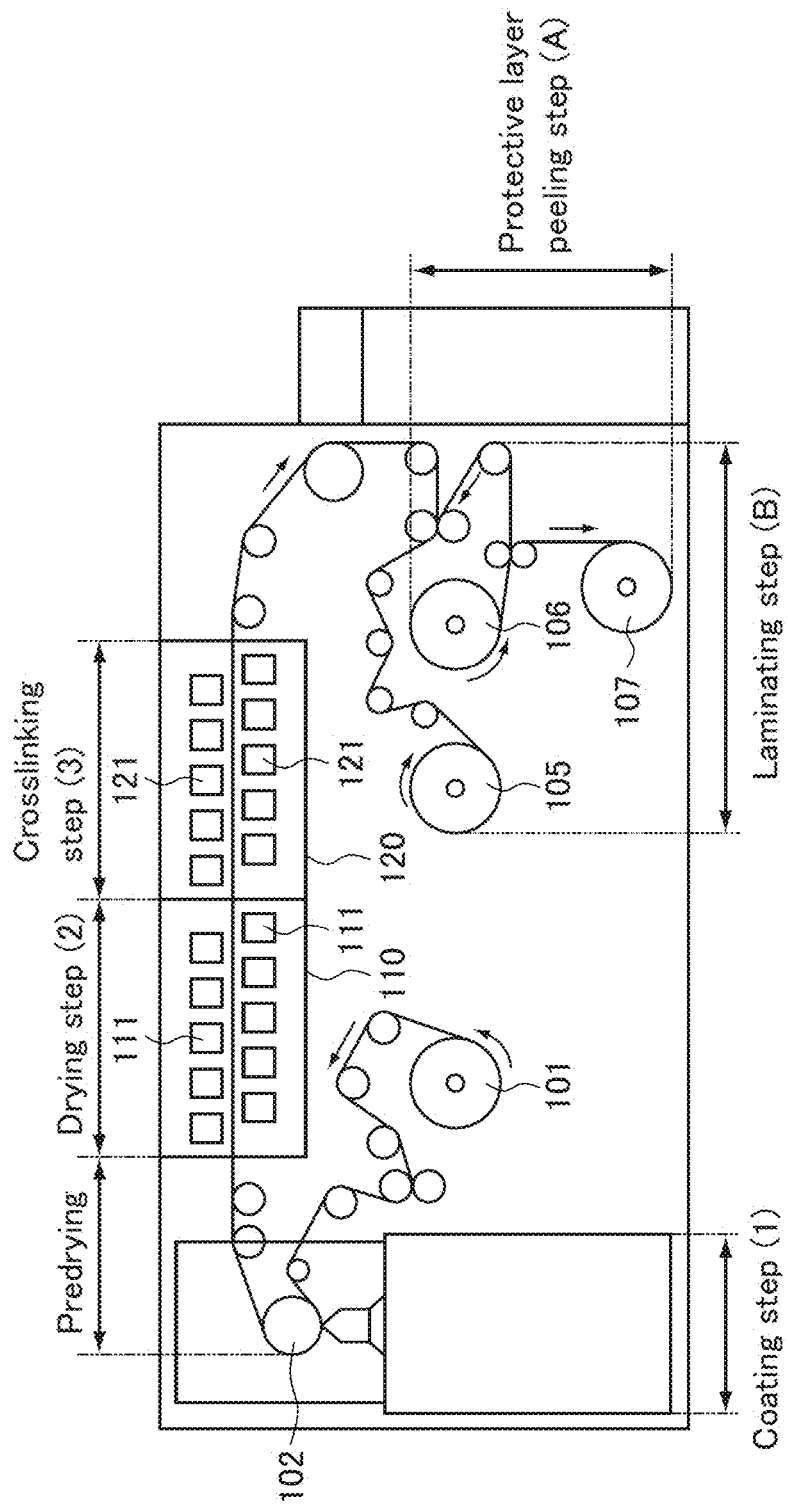
FIG. 4 is an illustration schematically showing an example of a part of the process of producing the flexible light-emitting device of the present invention and an example of the apparatus used therefor.

FIG. 4 schematically shows an example of a slot die coating apparatus and an example of the method of producing a laminated film of the present invention using the same. Although FIG. 4 is a cross sectional view, hatching is omitted for viewability.

As shown in FIG. 4, the steps of the method using this apparatus are carried out while conveying a high refractive index layer 30 in one direction by rollers. The conveying speed is not particularly limited, and is, for example, in the range from 1 to 100 m/min, 3 to 50 m/min, or 5 to 30 m/min.

First, the high refractive index layer 30 is delivered from a delivery roller 101 and conveyed to a coating roll 102, and the coating step (1) of coating a sol particle liquid 20" on the high refractive index layer 30 is carried out using the coating roll 102. Subsequently, the drying step (2) is carried out in an oven zone 110. In the coating apparatus shown in FIG. 4, a predrying step is carried out after the coating step (1) and before the drying step (2). The predrying step can be carried out at room temperature without heating. In the drying step (2), a heating unit 111 is used. As the heating unit 111, as described above, a hot air fan, a heating roller, a far-infrared heater, or the like can be used appropriately. For example, the drying step (2) may be divided into multiple steps, and the drying temperature may be set higher as coming to later steps.

The chemical treatment step (crosslinking step) (3) is carried out in a chemical treatment zone 120 after the drying step (2). In the chemical treatment step (3), for example, when the coating film 20' after drying contains a photoactive catalyst, light is emitted from lamps (light irradiation units) 121 disposed above and below the high refractive index layer 30. On the other hand, for example, when the coating film 20' after drying contains a thermoactive catalyst, the high refractive index layer 30 is heated using hot air fans 121 disposed above and below the high refractive index layer 30 instead of using the lamps (light irradiation devices) 121. By this crosslinking treatment, the pulverized products in the coating film 20' are chemically bonded, and the low refractive index layer 20 is cured and strengthened. Note that, although the chemical treatment step (3) is performed after the drying step (2) in the present Example, as described above, there is no particular limitation at which stage in the production method of the present invention the chemical bond among the pulverized products is caused. For example, as described above, the drying step (2) may also serve as the chemical treatment step (3). Even when the chemical bond is caused in the drying step (2), the chemical treatment step (3) may be performed to make the chemical bond among the pulverized products firmer.

Furthermore, in the steps (for example, predrying step, the coating step (1), step of preparing a coating liquid (for example, suspension), and the like) before the drying step (2), the chemical bond among the pulverized products may be caused. In the present invention, as described above, the chemical treatment step (crosslinking step) (3) is optional and is not always necessary. For example, after forming the low refractive index layer 20 by the drying step (2) as shown in FIG. 3A, the low refractive index layer 20 may be protected by covering it with a long resin film or the like (not shown). This allows continuous production without damaging the low refractive index layer 20 not requiring increase in the strength of the low refractive index layer 20 by the chemical treatment step (crosslinking step) (3), for example. Note that the resin film for covering the low refractive index layer 20 for protection may be peeled from the low refractive index layer 20 right before the laminating step (B), for example.

A roll 106 is provided. The roll 106 is obtained by winding the pressure-sensitive adhesive/adhesive layer-provided laminate, in which the pressure-sensitive adhesive/adhesive layer 40 is stacked on the light-emitting layer 10 and the pressure-sensitive adhesive/adhesive layer 40 is covered with a protective layer (separator) 50, around the roll. Then, as shown in FIG. 4, the protective layer peeling step (A) of peeling the protective layer 50 from the roll 106 is performed. The peeled protective layer 50 is wound as shown in FIG. 4, thereby obtaining a roll 107.

Then, after the chemical treatment step (crosslinking step) (3) (after the drying step (2) in the case where the chemical treatment step (crosslinking step) (3) is not performed), the laminating step (B) of laminating the pressure-sensitive adhesive/adhesive side of the pressure-sensitive adhesive/adhesive layer-provided laminate, in which the pressure-sensitive adhesive/adhesive layer 40 is stacked on the light-emitting layer 10, on the low refractive index layer 20 is performed. In this manner, a laminated film 1A having the structure shown in FIG. 2 can be obtained as a long laminated film. The produced laminated film 1A is wound by a winding roll 105.

Figure 5:
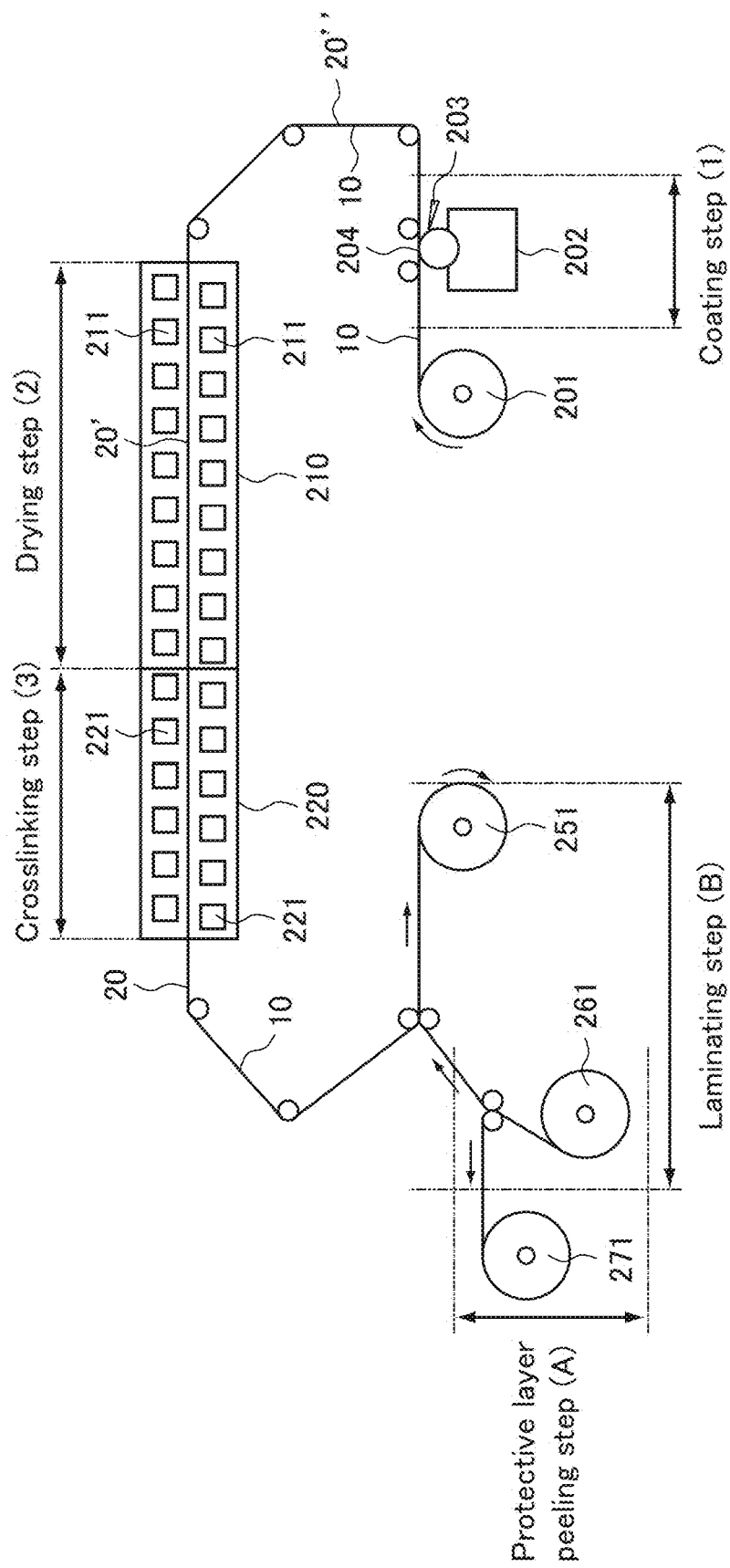
FIG. 5 is an illustration schematically showing another example of a part of the process of producing the flexible light-emitting device of the present invention and an example of the apparatus used therefor.

FIG. 5 schematically shows an example of a micro-gravure coating apparatus and an example of the method of forming a low refractive index layer using the same. Although FIG. 5 is a cross sectional view, hatching is omitted for viewability.

As shown in FIG. 5, the steps of the method using this apparatus are carried out while conveying the high refractive index layer 30 in one direction by rollers as in FIG. 4. The conveying speed is not particularly limited, and is, for example, in the range from 1 to 100 m/min, 3 to 50 m/min, or 5 to 30 m/min.

First, the coating step (1) of coating a sol particle liquid 20" on the high refractive index layer 30 is carried out while conveying the high refractive index layer 30 delivered from a delivery roller 201. As shown in FIG. 5, the coating of the sol particle liquid 20" is performed using a liquid reservoir 202, a doctor (doctor knife) 203, and a micro-gravure 204. Specifically, the sol particle liquid 20' in the liquid reservoir 202 is applied to the surface of the micro-gravure 204 and the sol particle liquid 20' is coated using the micro-gravure 204 while controlling the thickness to a predetermined thickness using a doctor 203. The micro-gravure 204 is merely illustrative. The present invention is not limited thereto, and any other coating unit may be adopted.

Subsequently, the drying step (2) is performed. Specifically, as shown in FIG. 5, the high refractive index layer 30 coated with the sol particle liquid 20" is conveyed into an oven zone 210 and the sol particle liquid 20" is dried by heating using heating units 211 disposed in the oven zone 210. The heating units 211 can be, for example, the same as the heating units 111 shown in FIG. 4. For example, the drying step (2) may be divided into multiple steps by dividing the oven zone 210 into multiple sections, and the drying temperature may be set higher as coming to later steps. The chemical treatment step (3) is carried out in a chemical treatment zone 220 after the drying step (2). In the chemical treatment step (3), for example, when the coating film 20' after drying contains a photoactive catalyst, the high refractive index layer 30 is irradiated with light emitted from lamps (light irradiation units) 221 disposed above and below the high refractive index layer 30. On the other hand, for example, when the coating film 20' after drying contains a thermoactive catalyst, the high refractive index layer 30 is heated using hot air fans (heating units) 221 disposed below the high refractive index layer 30 instead of using lamps (light irradiation devices) 221. By this crosslinking treatment, the pulverized products in the coating film 20' are chemically bonded, thereby forming the low refractive index layer 20. In the present invention, as described above, the chemical treatment step (crosslinking step) (3) is optional and is not always necessary. For example, as described in the description as to FIG. 4, after forming the low refractive index layer 20 by the drying step (2), the low refractive index layer 20 may be protected by covering it with a long resin film or the like (not shown). The resin film may be peeled from the low refractive index layer 20 right before the laminating step (B), for example.

A roll 261 is provided. The roll 261 is obtained by winding the pressure-sensitive adhesive/adhesive layer-provided laminate, in which the pressure-sensitive adhesive/adhesive layer 40 is stacked on the light-emitting layer 10 and the pressure-sensitive adhesive/adhesive layer 40 is covered with a protective layer (separator) 50, around the roll. Then, as shown in FIG. 5, the protective layer peeling step (A) of peeling the protective layer 50 from the roll 261 is performed. The peeled protective layer 50 is wound as shown in FIG. 4, thereby obtaining a roll 271.

Then, after the chemical treatment step (crosslinking step) (3) (after the drying step (2) in the case where the chemical treatment step (crosslinking step) (3) is not performed), the laminating step (B) of laminating the pressure-sensitive adhesive/adhesive side of the pressure-sensitive adhesive/adhesive layer-provided laminate, in which the pressure-sensitive adhesive/adhesive layer 40 is stacked on the light-emitting layer 10, on the low refractive index layer 20 is performed. In this manner, a laminated film 1A having the structure shown in FIG. 2 can be obtained as a long laminated film. The produced laminated film 1A is wound by a winding roll 251.

Then, the laminated film 1A produced by the method shown in FIG. 4 or FIG. 5 may be cut appropriately to obtain the flexible light-emitting device 1A shown in FIG. 2, for example. Note that, in the laminated film 1A producing step, as described above, one of or both of the strength improving step (aging step) (4) and the intermediate layer forming step (5) may or may not be performed after the chemical treatment step (crosslinking step) (3), for example.

[2. Uses of Flexible Light-Emitting Device]

The flexible light-emitting device of the present invention can be used, for example, for a lighting apparatus or an image display as described above. More specifically, the flexible light-emitting device of the present invention can be used, for example, as a flexible light-emitting device of an organic EL lighting apparatus, an organic EL image display, electronic paper, an inorganic EL image display, or an LED image display. The flexible light-emitting device of the present invention, however, is not limited thereto and can be used for any purpose.

EXAMPLES

The examples of the present invention are described below. The present invention, however, is not limited by the following examples.

Reference Example 1: Preparation of Coating Liquid (1) Gelation of Silicon Compound 0.95 g of MTMS which is the precursor of a silicon compound was dissolved in 2.2 g of DMSO. 0.5 g of 0.01 mol/L oxalic acid solution was added to the mixture, and the resultant was stirred at room temperature for 30 minutes to hydrolyze MTMS, thereby preparing tris(hydroxy)methylsilane.

0.38 g of ammonia water having a concentration of 28% and 0.2 g of pure water were added to 5.5 g of DMSO, then the aforementioned mixture that had been subjected to the hydrolysis treatment was added thereto, and the resultant was stirred at room temperature for 15 minutes to gelate tris(hydroxy)methylsilane, thereby obtaining a gelled silicon compound.

(2) Aging Treatment

The aging treatment was carried out as follows. The mixture that had been subjected to the gelation treatment was incubated at 40° C. for 20 hours.

(3) Pulverizing Treatment

Subsequently, the gelled silicon compound that had been subjected to the aging treatment was granulated into pieces of several millimeters to several centimeters using a spatula. 40 g of IPA was added thereto, the mixture was stirred lightly, and then was allowed to stand still at room temperature for 6 hours, thereby decanting a solvent and a catalyst in the gel. This decantation treatment was repeated three times, and the solvent replacement was completed. Then, the gelled silicon compound in the mixture was subjected to pulverizing treatment (high pressure media-less pulverization). This pulverizing treatment (high pressure media-less pulverization) was carried out using a homogenizer (product of SMT Corporation, product name: UH-50) as follows. That is, 1.85 g of the gelled compound, in which the solvent replacement had been completed, and 1.15 g of IPA were added to 5 cc screw bottle and pulverized for 2 minutes at 50 W and 20 kHz.

The gelled silicon compound in the mixture was pulverized by the pulverizing treatment, whereby the mixture was changed to a sol liquid containing the pulverized products. The volume average particle size showing particle size variations of the pulverized products contained in the mixture measured by a dynamic light scattering nanotrac particle size analyzer (product of NIKKISO CO., LTD., product name: UPA-EX150) was 0.50 to 0.70. To 0.75 g of the sol liquid, 0.062 g of methylethyl ketone (MEK) solution containing 1.5% photobase generator (product of Wako Pure Chemical Industries, Ltd., product name WPBG266) and 0.036 g of MEK solution containing 5% bis(trimethoxysilyl) ethane were added, thereby obtaining a coating liquid.

Reference Example 2: Formation of Low Refractive Index Layer Using Coating Liquid The coating liquid prepared in Reference Example 1 was applied (coated) to the surface of an acrylic film (high refractive index layer) having a thickness of 600 μm, a length of 100 m, and a refractive index of 1.51, thereby forming a coating film. The wet film thickness (thickness before drying) of the coating film at this moment was about 27 μm. The coating film was dried at 100° C. for 1 minute and the coating film after drying was irradiated with UV light (wavelength: 360 nm, amount of light irradiation (energy): 300 mJ/cm²), thereby obtaining the laminate in which the low refractive index layer is formed on the film (high refractive index layer). The refractive index of the low refractive index layer measured by the above-described method was 1.18.

Example 1

The flexible light-emitting device of the present Example was produced as described below. The flexible light-emitting device of the present Example is a flexible OLED (organic light-emitting diode, i.e., organic EL device). In the flexible light-emitting device of the present Example, a low refractive index layer 20 is stacked on a light-emitting layer 10 through a pressure-sensitive adhesive/adhesive layer 40 and a high refractive index layer 30 is stacked thereon as in the case of the flexible light-emitting device 1A shown in FIG. 2. In the light-emitting layer 10, as shown in FIG. 1, a first electrode 12, an organic EL layer 13, and a second electrode 14 are stacked on the base 11 on a side opposite that where the low refractive index layer 20 and the high refractive index layer 30 are stacked.

First, a laminate in which the low refractive index layer 20 is stacked on the high refractive index layer 30 was produced by the method of Reference Example 2. Note that, in the present Example, the haze of the low refractive index layer 20 was 0.7%. The light-emitting layer (OLED layer) 10 in which the first electrode 12, the organic EL layer 13, and the second electrode 14 are stacked on the base 11 was produced by the method described in JP 2014-89825 A. Then, an acrylic pressure-sensitive adhesive (product of Nitto Denko Corporation) with a thickness of 20 μm was applied to the light-emitting layer 10 on the base 11 side to form a pressure-sensitive adhesive/adhesive layer, and the low refractive index layer 20 of the laminate was laminated thereon, thereby producing the flexible light-emitting device (OLED) of the present Example.

Comparative Example 1

The flexible light-emitting device (OLED) was produced in the same manner as in Example 1 except that, instead of using the laminate in which the low refractive index layer 20 is stacked on the high refractive index layer 30, only high refractive index layer 30 on which the low refractive index layer 20 was not formed was laminated on the light-emitting layer (OLED layer) 10 on the base 11 side.

Figure 6:
FIG. 6 shows photographs showing the light leakage states in the cases where the flexible light-emitting device of Example and the flexible light-emitting device of Comparative Example are deformed (bent).
Figure 6:

The OLEDs of Example 1 and Comparative Example 1 were each bent so as to achieve the bending radius R=7 mm, and the light leakage at the end of each OLED was checked. The results are shown in the photographs of FIG. 6. As can be seen from FIG. 6, the light leakage was not found with the OLED of Example 1 whereas the light leakage was found with the OLED of Comparative Example 1.

This application claims priority from Japanese Patent Application No. 2015-192324 filed on Sep. 29, 2015. The entire subject matter of the Japanese Patent Application is incorporated herein by reference.

INDUSTRIAL APPLICABILITY

As described above, according to the flexible light-emitting device of the present invention, even if it is deformed, the light leakage is less liable to occur. The flexible light-emitting device of the present invention can be used, for example, for a lighting apparatus or an image display as described above. More specifically, the flexible light-emitting device of the present invention can be used, for example, as a flexible light-emitting device of an organic EL lighting apparatus, an organic EL image display, electronic paper, an inorganic EL image display, or an LED image display. The flexible light-emitting device of the present invention, however, is not limited thereto and can be used for any purpose.

EXPLANATION OF REFERENCE NUMERALS 10 light-emitting layer
11 base
12 first electrode
13 organic EL layer
14 second electrode
20 low refractive index layer
20' coating film (precursor layer)
20" sol particle liquid
30 high refractive index layer
40 pressure-sensitive adhesive/adhesive layer
50 protective layer (separator)
101 delivery roller
102 coating roll
110 oven zone
111 hot air fan (heating unit)
120 chemical treatment zone
121 lamp (light irradiation unit) or hot air fan (heating unit)
105 winding roll
106,107 roll
201 delivery roller
202 liquid reservoir
203 doctor (doctor knife)
204 micro-gravure
210 oven zone
211 heating unit
220 chemical treatment zone
221 lamp (light irradiation unit) or hot air fan (heating unit)
251 winding roll
261,271 roll

The invention claimed is:

1. A flexible light-emitting device, comprising:
a light-emitting layer;
a low refractive index layer; and
a high refractive index layer, wherein
the light-emitting layer, the low refractive index layer, and the high refractive index layer are stacked in this order,
the low refractive index layer has a refractive index lower than that of the light-emitting layer and has a haze of less than 5%, and
the high refractive index layer has a refractive index higher than that of the low refractive index layer,
wherein the low refractive index layer is stacked directly on the light-emitting layer, optionally with a pressure-sensitive adhesive/adhesive layer therebetween.

2. The flexible light-emitting device according to claim 1, wherein
the light-emitting layer comprises an organic EL layer.

3. The flexible light-emitting device according to claim 2, wherein
the light-emitting layer further comprises a base, a first electrode, and a second electrode, and
the first electrode, the organic EL layer, and the second electrode are stacked on the base in this order.

4. The flexible light-emitting device according to claim 3, wherein
the low refractive index layer and the high refractive index layer are stacked on the base on a side opposite that where the first electrode, the organic EL layer, and the second electrode are stacked.

5. A lighting apparatus comprising:
the flexible light-emitting device according to claim 1.

6. An image display comprising:
the flexible light-emitting device according to claim 1.

7. The flexible light-emitting device according to claim 1, wherein the low refractive index layer has a refractive index of less than 1.20.

\* \* \* \* \*